(12) United States Patent
Zhang et al.

(10) Patent No.: US 12,549,170 B2
(45) Date of Patent: Feb. 10, 2026

(54) SWITCH CIRCUIT AND ELECTRONIC DEVICE

(71) Applicant: Honor Device Co., Ltd., Shenzhen (CN)

(72) Inventors: Ziqi Zhang, Shenzhen (CN); Ni Sun, Shenzhen (CN); Song Huang, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 238 days.

(21) Appl. No.: 18/022,633

(22) PCT Filed: Sep. 8, 2022

(86) PCT No.: PCT/CN2022/117882
§ 371 (c)(1),
(2) Date: Jun. 3, 2024

(87) PCT Pub. No.: WO2023/093216
PCT Pub. Date: Jun. 1, 2023

(65) Prior Publication Data
US 2024/0313756 A1   Sep. 19, 2024

(30) Foreign Application Priority Data

Nov. 26, 2021 (CN) .......................... 202111425594.7

(51) Int. Cl.
*H03K 17/06* (2006.01)
*H02J 7/00* (2006.01)
*H03K 17/08* (2006.01)

(52) U.S. Cl.
CPC ...... *H03K 17/063* (2013.01); *H02J 7/007182* (2020.01); *H03K 2017/0806* (2013.01); *H03K 2217/0036* (2013.01)

(58) Field of Classification Search
CPC ............ H02J 7/342; H03K 2217/0081; H03K 17/063
See application file for complete search history.

(56) References Cited

U.S. PATENT DOCUMENTS 5,847,544 A    12/1998   Eguchi
8,598,937 B2*  12/2013   Lal .................... H10D 84/0163
                                                    327/437
(Continued)

FOREIGN PATENT DOCUMENTS

CN    101783666 A    7/2010
CN    106603052 A    4/2017
(Continued)

*Primary Examiner* — Daniel C Puentes
(74) *Attorney, Agent, or Firm* — Leydig, Voit & Mayer, Ltd.

(57) ABSTRACT

A switch circuit and an electronic device are provided. The switch circuit includes an external node, an internal node, an enhancement-mode gallium-nitride high-electron-mobility transistor, and a driver module. The enhancement-mode gallium-nitride high-electron-mobility transistor includes a first gate electrode, a first electrode, and a second electrode. The driver module includes a control terminal. The first gate electrode is coupled to the control terminal, the first electrode is coupled to the external node, and the internal node is coupled to the second electrode. The external node receives a charging voltage, and the driver module controls on or off of the enhancement-mode gallium-nitride high-electron-mobility transistor. When the enhancement-mode gallium-nitride high-electron-mobility transistor is turned on, the charging voltage is transmitted to the internal node. Alternatively, the internal node receives a charging voltage, and the driver module controls on or off of the enhancement-mode gallium-nitride high-electron-mobility transistor.

18 Claims, 16 Drawing Sheets

(56) References Cited

U.S. PATENT DOCUMENTS

| | | | |
|---|---|---|---|
| 9,960,157 B2 * | 5/2018 | Prechtl | ................. H10D 84/811 |
| 10,411,008 B2 | 9/2019 | Prechtl et al. | |
| 10,536,070 B1 | 1/2020 | Penzo et al. | |
| 2012/0275076 A1 | 11/2012 | Shono | |
| 2019/0207590 A1 | 7/2019 | Lueders et al. | |
| 2019/0326280 A1 | 10/2019 | Imam et al. | |
| 2024/0222996 A1 * | 7/2024 | Zhang | ................... H02J 7/0031 |

FOREIGN PATENT DOCUMENTS

| | | |
|---|---|---|
| CN | 110798053 A | 2/2020 |
| CN | 113519123 A | 10/2021 |
| CN | 115021736 A | 9/2022 |
| EP | 3562040 A1 | 10/2019 |
| EP | 3782953 A1 | 2/2021 |
| WO | 2020237632 A1 | 12/2020 |

* cited by examiner

SWITCH CIRCUIT AND ELECTRONIC DEVICE

CROSS-REFERENCE TO RELATED APPLICATIONS

This application is a national stage of International Application No. PCT/CN2022/117882, filed on Sep. 8, 2022, which claims priority to Chinese Patent Application No. 202111425594.7, filed on Nov. 26, 2021. The disclosures of both of the aforementioned applications are hereby incorporated by reference in their entireties.

TECHNICAL FIELD

This application relates to the field of circuit technologies, and in particular, to a switch circuit and an electronic device.

BACKGROUND

Bidirectional charging means that terminals such as a mobile phone, a tablet computer, and a notebook computer may be charged by a charger, a mobile power supply, and the like, that is, forward charging; and electronic devices such as the mobile phone, the tablet computer, and the notebook computer may also be used as mobile power supplies to directly charge other to-be-charged electronic devices, for example, may charge electronic devices such as the mobile phone, the tablet computer, the notebook computer, and the smart wearable device, that is, reverse charging. Electronic devices with a bidirectional charging function have attracted more users' attention because they can effectively supply power to other electronic devices in emergency cases in time.

To implement bidirectional on and off functions of bidirectional charging, two back-to-back metal oxide semiconductor field effect transistors (MOSFETs) are disposed in an electronic device, to avoid that when one MOSFET is used, because the MOSFET has a body diode, even if the MOSFET is turned off, currents still leak through the body diode of the MOSFET, in other words, one MOSFET cannot implement the off function. However, the MOSFET has a large conductive impedance and a low switching frequency, resulting in severe heating of components and limited input and output powers.

SUMMARY

To resolve the foregoing technical problem, this application provides a switch circuit and an electronic device, to reduce a conductive impedance.

According to a first aspect, an embodiment of this application provides a switch circuit. The switch circuit includes: an external node, an internal node, a first switch module, and a driver module. The first switch module includes an enhancement-mode gallium-nitride high-electron-mobility transistor. The enhancement-mode gallium-nitride high-electron-mobility transistor includes a first gate electrode, a first electrode, and a second electrode. The driver module includes a control terminal. The first gate electrode is coupled to the control terminal, the first electrode is coupled to the external node, and the internal node is coupled to the second electrode. The external node is configured to receive a charging voltage, and transmit the charging voltage to the enhancement-mode gallium-nitride high-electron-mobility transistor; the driver module is configured to control on or off of the enhancement-mode gallium-nitride high-electron-mobility transistor; and when the enhancement-mode gallium-nitride high-electron-mobility transistor is turned on, the charging voltage is transmitted to the internal node, so as to be transmitted to a charging conversion chip through the internal node; or the internal node is configured to receive a charging voltage, and transmit the charging voltage to the enhancement-mode gallium-nitride high-electron-mobility transistor; the driver module is configured to control on or off of the enhancement-mode gallium-nitride high-electron-mobility transistor; and when the enhancement-mode gallium-nitride high-electron-mobility transistor is turned on, the charging voltage is transmitted to the external node, so as to be transmitted to a to-be-charged electronic device through the external node.

The driver module controls on or off of the enhancement-mode gallium-nitride high-electron-mobility transistor, thereby implementing bidirectional on and off functions of the switch circuit. In addition, the enhancement-mode gallium-nitride high-electron-mobility transistor does not have a body diode. Therefore, when the enhancement-mode gallium-nitride high-electron-mobility transistor is turned off, no current leakage occurs. In this way, the bidirectional on and off functions can be implemented by using only one enhancement-mode gallium-nitride high-electron-mobility transistor. Compared with two back-to-back metal oxide semiconductor field effect transistors, a layout size of components is reduced. In addition, the enhancement-mode gallium-nitride high-electron-mobility transistor has a low conductive impedance. Therefore, by disposing the enhancement-mode gallium-nitride high-electron-mobility transistor, a loss and power consumption of the switch circuit can be reduced, and a heating problem of components can further be alleviated.

For example, when the external node receives the charging voltage, the external node may be coupled to a charger, and the internal node may be coupled to the charging conversion chip. For example, when the internal node receives the charging voltage, the internal node may be coupled to the charging conversion chip, and the external node may be coupled to the to-be-charged electronic device.

For example, the to-be-charged electronic device may be a to-be-charged mobile phone.

In some possible implementations, the driver module further includes a reference terminal, and the second electrode of the enhancement-mode gallium-nitride high-electron-mobility transistor and the reference terminal of the control module are coupled to the reference point. When the external node receives the charging voltage, the driver module sends a first drive voltage to the first gate electrode based on a voltage of the reference point, and the enhancement-mode gallium-nitride high-electron-mobility transistor is turned on in response to the first drive voltage and transmits the charging voltage to the internal node; and the driver module further sends a second drive voltage to the first gate electrode based on the voltage of the reference point, and the enhancement-mode gallium-nitride high-electron-mobility transistor is turned off in response to the second drive voltage; or when the internal node receives the charging voltage, the driver module sends a third drive voltage to the first gate electrode based on a voltage of the reference point, and the enhancement-mode gallium-nitride high-electron-mobility transistor is turned on in response to the third drive voltage and transmits the charging voltage to the external node; and the driver module further sends a fourth drive voltage to the first gate electrode, and the enhancement-mode gallium-nitride high-electron-mobility transistor is turned off in response to the fourth drive voltage.

By disposing the enhancement-mode gallium-nitride high-electron-mobility transistor, during forward charging, the driver module outputs the first drive voltage based on the voltage of the reference point, so that a difference between a voltage of the first gate electrode and a voltage of the second electrode is greater than threshold voltages of the first gate electrode and the second electrode of the enhancement-mode gallium-nitride high-electron-mobility transistor, and further, the first switch module can remain a turn-on state, ensuring normal charging. Upon forward turn-off (when charging is completed or an exception occurs), the driver module outputs the second drive voltage based on the voltage of the reference point, so that the difference between the voltage of the first gate electrode and the voltage of the second electrode is less than the threshold voltages of the first gate electrode and the second electrode of the enhancement-mode gallium-nitride high-electron-mobility transistor, and further, the first switch module is turned off from on. During reverse charging, the driver module outputs a third drive voltage based on the voltage of the reference point, so that the difference between the voltage of the first gate electrode and the voltage of the first electrode is greater than the threshold voltages of the first gate electrode and the first electrode of the enhancement-mode gallium-nitride high-electron-mobility transistor, and further, the first switch module can remain a turn-on state, ensuring normal charging. Upon reverse turn-off (when charging is completed or an exception occurs), to avoid that the first switch module is turned on when a voltage of the first electrode decreases, the driver module outputs a fourth drive voltage through the control terminal, so that the difference between the voltage of the first gate electrode and the voltage of the first electrode is always less than the threshold voltages of the first gate electrode and the first electrode of the enhancement-mode gallium-nitride high-electron-mobility transistor, and further, the first switch module is always in the turn-off state. In this way, the bidirectional on and off functions are implemented. In addition, during forward charging, forward turn-off, and reverse charging, the driver module outputs a drive voltage based on the voltage of the reference point, simplifying an operation process of the driver module.

In some possible implementations, on the basis that the second electrode of the enhancement-mode gallium-nitride high-electron-mobility transistor and the reference terminal of the control module are coupled to the reference point, the switch circuit further includes a second switch module. The second switch module is configured to: when the driver module sends a fourth drive voltage to the first gate electrode, prevent the internal node from transmitting the received charging voltage to the reference point. The driver module sends the fourth drive voltage to the first gate electrode based on the voltage of the reference point, and the enhancement-mode gallium-nitride high-electron-mobility transistor is turned off in response to the fourth drive voltage. That is, the drive voltages (the first drive voltage, the second drive voltage, the third drive voltage, and the fourth drive voltage) output by the driver module vary with the reference point. In this way, operations of the driver module can further be simplified.

In some possible implementations, on the basis that the switch circuit includes the second switch module, the second switch module includes an n-type metal oxide semiconductor field effect transistor; the n-type metal-oxide semiconductor field-effect transistor includes a second gate electrode, a source electrode, and a drain electrode; and the source electrode is coupled to the second electrode, and the drain electrode is coupled to the internal node. A signal obtained by the second gate electrode can control on or off of the n-type metal-oxide semiconductor field-effect transistor. When the n-type metal-oxide semiconductor field-effect transistor is disposed between the internal node and the second electrode of the enhancement-mode gallium-nitride high-electron-mobility transistor, the reference point may be spaced from the internal node. In this way, during forward charging, forward turn-off, and reverse charging, the driver module outputs a drive voltage based on the voltage of the reference point, so that the first switch module is turned on during forward charging and reverse charging, and is turned off during forward turn-off. Moreover, during reverse turn-off, the driver module can output a drive voltage based on the voltage of the reference point, so that the first switch module is completely turned off during reverse turn-off. In other words, at different stages, the driver module outputs the drive voltage based on the voltage of the reference point. In this way, the operation process of the driver module is further simplified. In addition, in this embodiment, the switch circuit includes the enhancement-mode bidirectional gallium-nitride high-electron-mobility transistor and the n-type metal oxide semiconductor field effect transistor. However, because the enhancement-mode bidirectional gallium-nitride high-electron-mobility transistor has a low conductive impedance, compared with two metal oxide semiconductor field effect transistors, a conductive impedance of the switch circuit in this embodiment is reduced. It is concluded after verification that the conductive impedance of the switch circuit including the enhancement-mode bidirectional gallium-nitride high-electron-mobility transistor and the n-type metal oxide semiconductor field effect transistor can be reduced by 25% compared with that of the switch circuit including two metal oxide semiconductor field effect transistors. In this way, a switching loss and power consumption can be reduced, and heating can be alleviated.

In some possible implementations, on the basis that the switch circuit includes the second switch module, the second switch module includes an n-type metal oxide semiconductor field effect transistor; the n-type metal-oxide semiconductor field-effect transistor includes a second gate electrode, a source electrode, and a drain electrode; and the drain electrode is separately coupled to the second electrode and the internal node. A signal obtained by the second gate electrode can control on or off of the n-type metal-oxide semiconductor field-effect transistor. When the n-type metal-oxide semiconductor field-effect transistor is disposed between the reference point and the second electrode of the enhancement-mode gallium-nitride high-electron-mobility transistor, the reference point may be spaced from the internal node. In this way, during forward charging, forward turn-off, and reverse charging, the driver module outputs a drive voltage based on the voltage of the reference point, so that the first switch module is turned on during forward charging and reverse charging, and is turned off during forward turn-off. Moreover, during reverse turn-off, the driver module can output a drive voltage based on the voltage of the reference point, so that the first switch module is completely turned off during reverse turn-off. In other words, at different stages, the driver module outputs the drive voltage based on the voltage of the reference point. In this way, the operation process of the driver module is further simplified. In addition, in this embodiment, the switch circuit includes the enhancement-mode bidirectional gallium-nitride high-electron-mobility transistor and the n-type metal oxide semiconductor field effect transistor. However, because the enhancement-mode bidirectional gallium-nitride high-electron-mobility transistor has a low conductive impedance, compared with two metal oxide semiconductor field effect transistors, a conductive impedance of the switch circuit in this embodiment is reduced. Furthermore, because the second switch module is not located on a charging path, the second switch module may be a low-power component. It is concluded after verification that the conductive impedance of the switch circuit (not located on the charging path) including the enhancement-mode bidirectional gallium-nitride high-electron-mobility transistor and the n-type metal oxide semiconductor field effect transistor in this embodiment can be reduced by at least 40% compared with that of the switch circuit including two metal oxide semiconductor field effect transistors. In this way, a switching loss and power consumption can further be reduced, and heating can be alleviated.

In some possible implementations, on the basis that the drain electrode is separately coupled to the second electrode and the internal node and the source electrode is coupled to the reference point, a range of a conductive impedance of the n-type metal oxide semiconductor field effect transistor is greater than or equal to 1 ohm and less than or equal to 100 ohms, a withstand voltage range from the second gate electrode to the source electrode of the n-type metal oxide semiconductor field effect transistor is greater than or equal to 5 V and less than or equal to 60 V, and a range of a drain-source breakdown voltage of the n-type metal oxide semiconductor field effect transistor is greater than or equal to 10 V and less than or equal to 120 V. That is, the second switch module is a low-power metal oxide semiconductor field effect transistor, and a loss of the second switch module may be relatively low, thereby further reducing the power consumption of the switch circuit.

In some possible implementations, on the basis that the second switch module includes the n-type metal oxide semiconductor field effect transistor, the first gate electrode is coupled to the second gate electrode. The first gate electrode may separately obtain a signal, or may be coupled to the second gate electrode and control on or off of both the first switch module and the second switch module by using a signal output by the control terminal of the driver module. In this way, a structure of the switch circuit is simplified.

In some possible implementations, the switch circuit further includes a resistor. A first terminal of the resistor is coupled to the reference point, and a second terminal of the resistor is grounded. By disposing the resistor, during forward turn-off and reverse turn-off, the voltage of the reference point can decrease to 0 V rapidly, and the voltage of the driver module can also decrease to 0 V rapidly based on the voltage of the reference point, in other words, charges in the enhancement-mode bidirectional gallium-nitride high-electron-mobility transistor and the n-type metal oxide semiconductor field effect transistor are discharged rapidly. Further, the enhancement-mode bidirectional gallium-nitride high-electron-mobility transistor and the n-type metal oxide semiconductor field effect transistor are turned off rapidly.

In some possible implementations, on the basis that the switch circuit includes the resistor, a resistance of the resistor is greater than 100 kilohms. In this way, when the reference point discharges to the ground, a current will not be too large. In addition, the voltage of the reference point can decrease to 0 V rapidly.

In some possible implementations, the enhancement-mode gallium-nitride high-electron-mobility transistor may be an ordinary enhancement-mode bidirectional gallium-nitride high-electron-mobility transistor, to be specific, a gate-source threshold voltage and a gate-drain threshold voltage of the enhancement-mode gallium-nitride high-electron-mobility transistor are different; or the enhancement-mode gallium-nitride high-electron-mobility transistor may be an enhancement-mode bidirectional gallium-nitride high-electron-mobility transistor, to be specific, threshold voltages of the gate electrode and the second electrode are equal to threshold voltages of the gate electrode and the first electrode.

According to a second aspect, an embodiment of this application provides an electronic device. The electronic device includes the switch circuit according to any one of the implementations of the first aspect, and can implement all effects of the foregoing switch circuit.

DESCRIPTION OF EMBODIMENTS

The following describes the technical solutions in embodiments of this application clearly and completely with reference to the accompanying drawings in the embodiments of this application. Obviously, the described embodiments are some not all embodiments of this application. All other embodiments obtained by a person of ordinary skill in the art based on the embodiments of this application without creative efforts shall fall within the protection scope of this application.

The term "and/or" used herein only describes an association relationship between associated objects and represents that three relationships may exist. For example, A and/or B may represent the following three cases: Only A exists, both A and B exist, and only B exists.

In the specification and claims in the embodiments of this application, "first", "second", and the like are used to distinguish between different objects, but are not used to describe a specific order of objects. For example, a first target object, a second target object, and the like are used to distinguish between different target objects, but are not used to describe a specific order of target objects.

In the embodiments of the present application, words such as "exemplarily" or "for example" are used to provide examples, illustrations, or descriptions. Any embodiment or design described in the embodiments of the present application as "exemplary" or "such as" should not be construed as preferred or advantageous over other embodiments or designs. To be precise, the use of words such as "exemplary" or "such as" is intended to present the related concepts in a specific manner.

In the description of the embodiments of the present application, unless otherwise specified, the meaning of "plurality" refers to two or more. For example, a plurality of processing units refer to two or more processing units, and a plurality of systems refer to two or more systems.

An embodiment of this application provides an electronic device. The electronic device provided in this embodiment of this application may be a mobile phone, a computer, a tablet computer, a personal digital assistant (PDA), a vehicle-mounted computer, a television, a smart wearable device, a smart home device, or the like. A specific form of the electronic device is not particularly limited in this embodiment of this application. For ease of description, an example in which the electronic device is a mobile phone is used below for description.

A specific structure and use of the electronic device provided in this embodiment of this application are described below.

Figure 1:
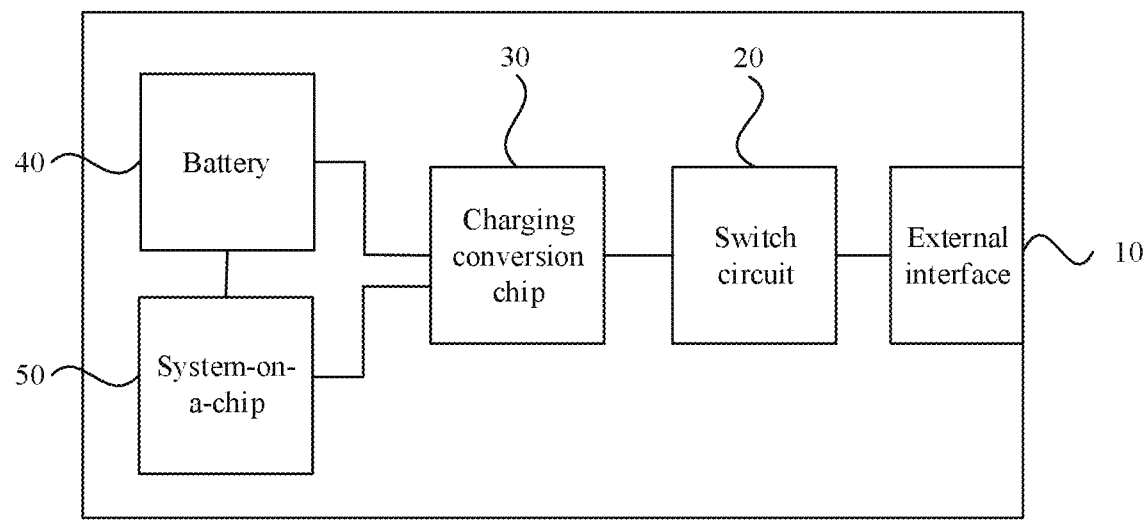
FIG. 1 is a schematic structural diagram of an electronic device according to an embodiment of this application.

FIG. 1 is a schematic structural diagram of an electronic device according to an embodiment of this application. A mobile phone 100 includes: an external port 10, a switch circuit 20, a charging conversion chip 30, a battery 40, a system-on-a-chip (SoC) 50, and the like. The system-on-a-chip (SoC) 50 is integrated with, for example, a central processing unit (CPU), a graphic processing unit (GPU), a modem, and the like. By providing the external port 10, the mobile phone 100 can be coupled to an external device. The external port 10 may be, for example, a USB port. The external device may be, for example, an electronic device such as a charger, a mobile power supply, a headset, a to-be-charged mobile phone, a tablet computer, or a notebook computer. The system-on-a-chip (SoC) 50 may be coupled to, for example, the external port 10. The system-on-a-chip (SoC) 50 may receive a voltage of the external port 10, and identify, based on a charging protocol, a type of an external device connected to the external port 10, to determine whether the external port 10 is connected to a to-be-charged mobile phone or a charger.

Figure 2:
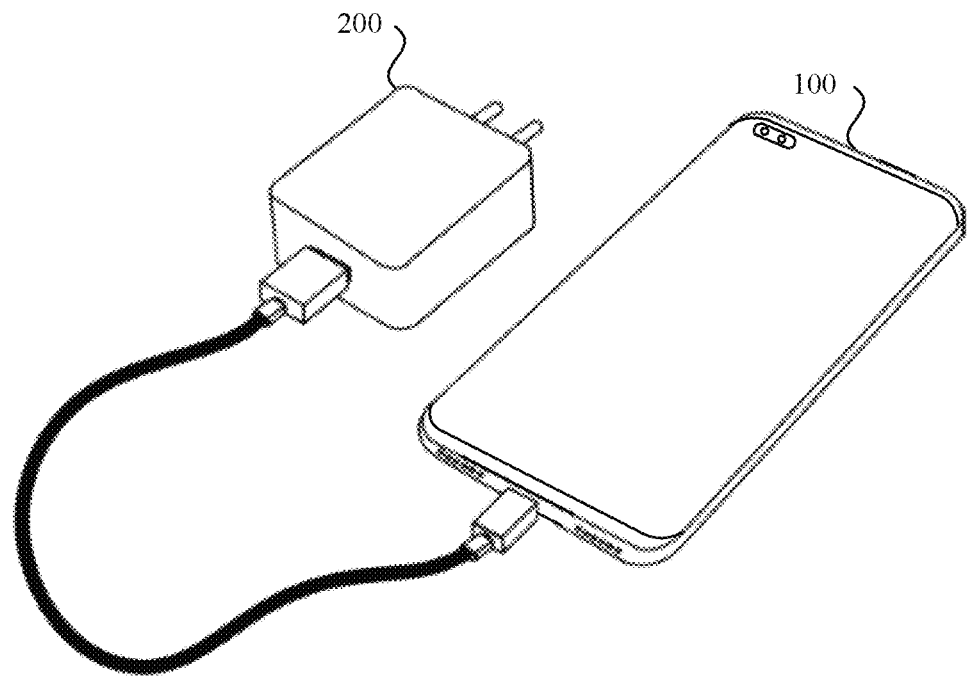
FIG. 2 is a schematic diagram of an application scenario of an electronic device according to an embodiment of this application.

For example, with reference to FIG. 1 and FIG. 2, when the external device connected to the external port 10 is a charger 200, that is, when the charger 200 needs to charge the mobile phone 100, the switch circuit 20 is turned on. A charging voltage that is output by the charger 200 is transmitted to the charging conversion chip 30 through the external port 10 and the switch circuit 20. The charging conversion chip 30 converts the charging voltage, and outputs the converted voltage to the battery 40 to charge the battery 40. In addition, the converted voltage is transmitted to the system-on-a-chip (SoC) 50 to power the CPU, the GPU, the modem, and the like that are integrated in the system-on-a-chip (SoC) 50, ensuring normal operation of the CPU, the GPU, and the modem. After charging is completed, the switch circuit 20 is turned off, and the charging voltage that is output by the charger 200 cannot be transmitted to the charging conversion chip 30. The charging conversion chip 30 cannot supply power to the battery 40, and the CPU, the GPU, the modem, and the like that are integrated in the system-on-a-chip (SoC) 50. In this case, the battery 40 provides voltages to the CPU, the GPU, the modem, and the like that are integrated in the system-on-a-chip (SoC) 50, ensuring normal operation of the CPU, the GPU, the modem, and the like that are integrated in the system-on-a-chip (SoC) 50.

Figure 3:
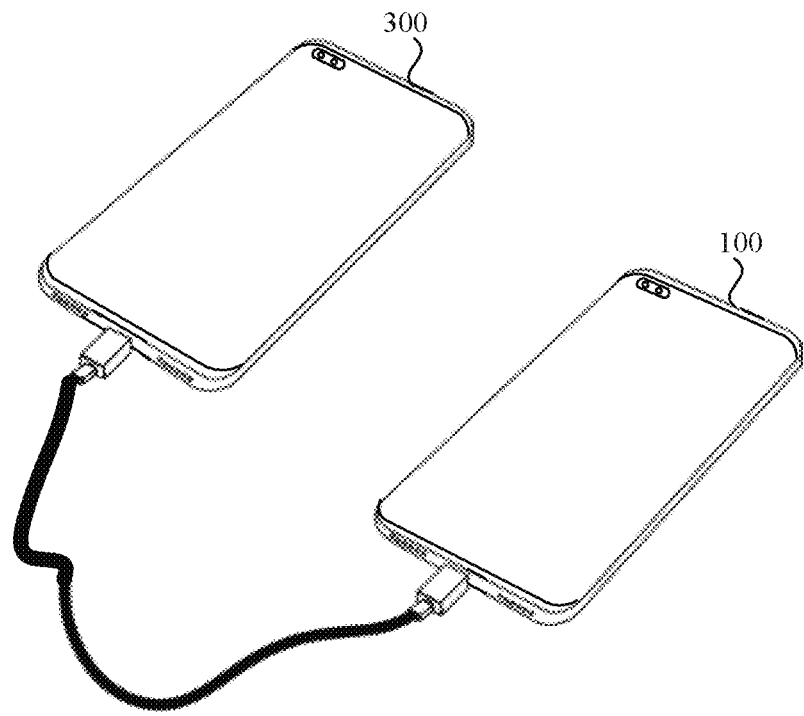
FIG. 3 is a schematic diagram of an application scenario of an electronic device according to an embodiment of this application.

For example, with reference to FIG. 1 and FIG. 3, when the external device connected to the external port 10 is a to-be-charged mobile phone 300, that is, when the mobile phone 100 needs to charge the to-be-charged mobile phone 300, the switch circuit 20 is turned on. The charging voltage that is output by the battery 40 is transmitted to the to-be-charged mobile phone 300 through the charging conversion chip 30, the switch circuit 20, and the external port 10 to charge the to-be-charged mobile phone 300.

To resolve the problem mentioned in the background, an embodiment of this application provides a switch circuit. The switch circuit includes a first switch module and a driver module. The first switch module is an enhancement-mode gallium-nitride high-electron-mobility transistor. The enhancement-mode gallium-nitride high-electron-mobility transistor includes a first gate electrode, a first electrode, and a second electrode. The driver module is coupled to the first gate electrode, and is configured to output a drive voltage to the first gate electrode.

It can be understood that on or off of the enhancement-mode gallium-nitride high-electron-mobility transistor is related to a threshold voltage thereof.

For the enhancement-mode gallium-nitride high-electron-mobility transistor, during forward charging (when a voltage at the first electrode needs to be transmitted to the second electrode), if a difference between the voltage of the first gate electrode and the voltage of the second electrode is greater than the threshold voltage, the enhancement-mode gallium-nitride high-electron-mobility transistor is turned on; or if a difference between the voltage of the first gate electrode and the voltage of the second electrode is less than the threshold voltage, the enhancement-mode gallium-nitride high-electron-mobility transistor is turned off. During reverse charging (when a voltage at the second electrode needs to be transmitted to the first electrode), if a difference between the voltage of the first gate electrode and the voltage of the first electrode is greater than the threshold voltage, the enhancement-mode gallium-nitride high-electron-mobility transistor is turned on; or if a difference between the voltage of the first gate electrode and the voltage of the first electrode is less than the threshold voltage, the enhancement-mode gallium-nitride high-electron-mobility transistor is turned off.

Because the voltage of the first gate electrode is the drive voltage that is output by the driver module, on or off of the enhancement-mode gallium-nitride high-electron-mobility transistor may be controlled by the drive voltage output by the driver module. In other words, to implement bidirectional on and off functions of bidirectional charging, the drive voltage is a voltage that is output by the driver module to the first gate electrode, and the voltage can control on or off of the enhancement-mode gallium-nitride high-electron-mobility transistor. In addition, the enhancement-mode gallium-nitride high-electron-mobility transistor does not have a body diode. Therefore, when the enhancement-mode gallium-nitride high-electron-mobility transistor is turned off, no current leakage occurs. In this way, the bidirectional on and off functions can be implemented by using only the enhancement-mode gallium-nitride high-electron-mobility transistor. Compared with two back-to-back MOS tubes, a layout size of components is reduced. In addition, the enhancement-mode gallium-nitride high-electron-mobility transistor has a low conductive impedance. Therefore, by disposing the enhancement-mode gallium-nitride high-electron-mobility transistor, a loss and power consumption of the switch circuit can be reduced, and heating can be alleviated.

A type of the enhancement-mode gallium-nitride high-electron-mobility transistor is not specifically limited in this embodiment of this application. For example, the enhancement-mode gallium-nitride high-electron-mobility transistor may be an ordinary enhancement-mode gallium-nitride high-electron-mobility transistor, or may be an enhancement-mode bidirectional gallium-nitride high-electron-mobility transistor.

When the first switch module is an ordinary enhancement-mode gallium-nitride high-electron-mobility transistor, the first electrode is, for example, a drain electrode of the enhancement-mode gallium-nitride high-electron-mobility transistor, and the second electrode is, for example, a source electrode of the enhancement-mode gallium-nitride high-electron-mobility transistor. During forward charging (when a voltage at the drain electrode needs to be transmitted to the source electrode), if a difference between the voltage of the first gate electrode of the enhancement-mode gallium-nitride high-electron-mobility transistor and the voltage of the source electrode is greater than a gate-source threshold voltage, the enhancement-mode gallium-nitride high-electron-mobility transistor is turned on; or if a difference between the voltage of the first gate electrode of the enhancement-mode gallium-nitride high-electron-mobility transistor and the voltage of the source electrode is less than a gate-source threshold voltage, the enhancement-mode gallium-nitride high-electron-mobility transistor is turned off. During reverse charging (when a voltage at the source electrode needs to be transmitted to the drain electrode), if a difference between the voltage of the first gate electrode of the enhancement-mode gallium-nitride high-electron-mobility transistor and the voltage of the drain electrode is greater than a gate-drain threshold voltage, the enhancement-mode gallium-nitride high-electron-mobility transistor is turned on; or if a difference between the voltage of the first gate electrode of the enhancement-mode gallium-nitride high-electron-mobility transistor and the voltage of the drain electrode is less than a gate-drain threshold voltage, the enhancement-mode gallium-nitride high-electron-mobility transistor is turned on. The gate-source threshold voltage is different from the gate-drain threshold voltage.

The enhancement-mode bidirectional gallium-nitride high-electron-mobility transistor means that the first electrode and the second electrode of the enhancement-mode gallium-nitride high-electron-mobility transistor are equivalent. In other words, a distance from an area in which the second electrode is located to a channel region is equal to a distance from an area in which the first electrode is located to the channel region, a material of the area in which the second electrode is located is the same as a material of the area in which the first electrode is located, and the two areas have same component structures. During forward charging (when a voltage at the first electrode needs to be transmitted to the second electrode), if a difference between the voltage of the first gate electrode of the enhancement-mode bidirectional gallium-nitride high-electron-mobility transistor and the voltage of the second electrode is greater than threshold voltages of the gate electrode and the second electrode, the enhancement-mode bidirectional gallium-nitride high-electron-mobility transistor is turned on; or if a difference between the voltage of the first gate electrode of the enhancement-mode bidirectional gallium-nitride high-electron-mobility transistor and the voltage of the second electrode is less than threshold voltages of the gate electrode and the second electrode, the enhancement-mode bidirectional gallium-nitride high-electron-mobility transistor is turned off. During reverse charging (when a voltage at the second electrode needs to be transmitted to the first electrode), if a difference between the voltage of the first gate electrode of the enhancement-mode bidirectional gallium-nitride high-electron-mobility transistor and the voltage of the first electrode is greater than threshold voltages of the gate electrode and the first electrode, the enhancement-mode bidirectional gallium-nitride high-electron-mobility transistor is turned on; or if a difference between the voltage of the first gate electrode of the enhancement-mode bidirectional gallium-nitride high-electron-mobility transistor and the voltage of the first electrode is less than threshold voltages of the gate electrode and the first electrode, the enhancement-mode bidirectional gallium-nitride high-electron-mobility transistor is turned off. The threshold voltages of the gate electrode and the second electrode are equal to the threshold voltages of the gate electrode and the first electrode.

It should be noted that a specific structure of the driver module is not limited in this embodiment of this application. For example, the driver module includes a driver chip and a microcontroller unit (MCU). The MCU and the driver chip may be separately disposed, or the MUC may be integrated on the driver chip.

There are a plurality of types of switch circuits in which an enhancement-mode gallium-nitride high-electron-mobility transistor is disposed to reduce power consumption. A typical example is used below for detailed illustration. To describe the subsequent solutions more conveniently and clearly, the following uses an example in which the first switch module is an enhancement-mode bidirectional gallium-nitride high-electron-mobility transistor is used for description. It can be understood that because the threshold voltages of the first gate electrode and the second electrode of the enhancement-mode bidirectional gallium-nitride high-electron-mobility transistor are equal to the threshold voltages of the first gate electrode and the first electrode, the threshold voltages of the first gate electrode and the second electrode and the threshold voltages of the first gate electrode and the first electrode are all referred to as threshold voltages of the enhancement-mode bidirectional gallium-nitride high-electron-mobility transistor. In addition, to distinguish between drive voltages received by the first gate electrode of the enhancement-mode bidirectional gallium-nitride high-electron-mobility transistor at different stages, in the following example, during forward charging, the drive voltage received by the first gate electrode of the enhancement-mode bidirectional gallium-nitride high-electron-mobility transistor is a first drive voltage, where the first drive voltage can control the enhancement-mode bidirectional gallium-nitride high-electron-mobility transistor to be turned on during forward charging; during forward turn-off, a drive voltage received by the first gate electrode of the enhancement-mode bidirectional gallium-nitride high-electron-mobility transistor is a second drive voltage, where the second drive voltage can control forward turn-off of the enhancement-mode bidirectional gallium-nitride high-electron-mobility transistor; during reverse charging, the drive voltage received by the first gate electrode of the enhancement-mode bidirectional gallium-nitride high-electron-mobility transistor is a third drive voltage, where the third drive voltage can control the enhancement-mode bidirectional gallium-nitride high-electron-mobility transistor to be turned on during reverse charging; and during reverse turn-off, the drive voltage received by the first gate electrode of the enhancement-mode bidirectional gallium-nitride high-electron-mobility transistor is a fourth drive voltage, where the fourth drive voltage can control reverse turn-off of the enhancement-mode bidirectional gallium-nitride high-electron-mobility transistor. The following content does not constitute a limitation on this application.

Figure 4:
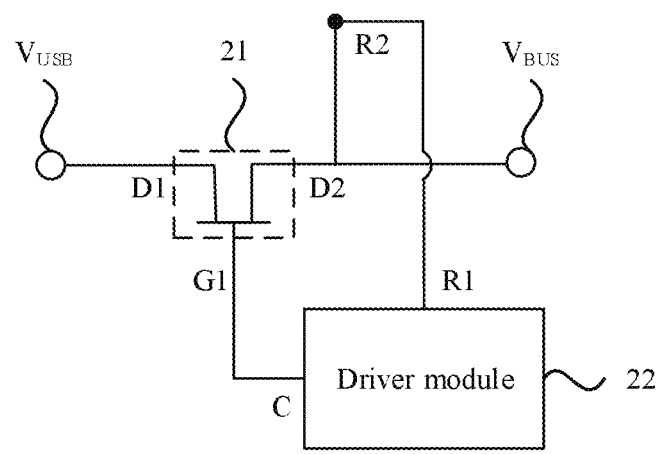
FIG. 4 is a schematic structural diagram of a switch circuit according to an embodiment of this application.
Figure 5:
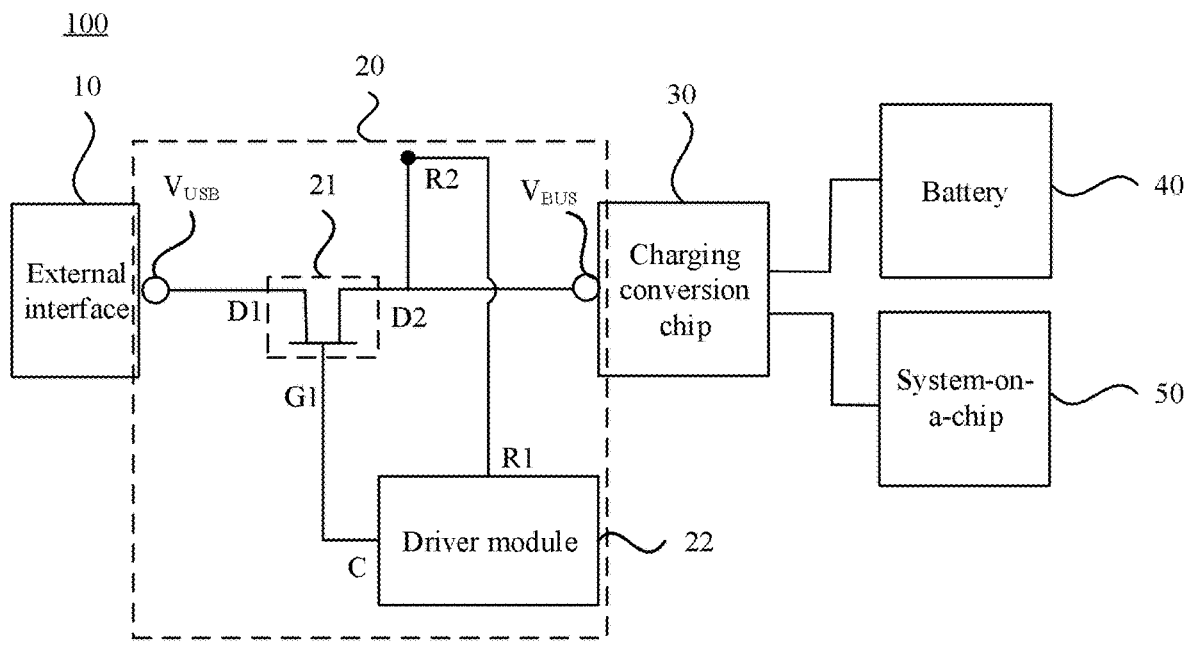
FIG. 5 is a schematic structural diagram of another electronic device according to an embodiment of this application.

In an example, as shown in FIG. 4, the switch circuit 20 includes an internal node $V_{BUS}$, an external node $V_{USB}$, a first switch module 21, and a driver module 22. The first switch module 21 includes an enhancement-mode bidirectional gallium-nitride high-electron-mobility transistor. The enhancement-mode bidirectional gallium-nitride high-electron-mobility transistor includes a first gate electrode G1, a first electrode D1, and a second electrode D2. The driver module 22 includes a reference terminal R1 and a control terminal C. The first electrode D1 is coupled to the external node $V_{USB}$. The second electrode D2 is coupled to the reference point R2. The reference terminal R1 is coupled to the reference point R2. The internal node $V_{BUS}$ is coupled to the second electrode D2. The control terminal C of the driver module 22 is coupled to the first gate electrode G1. The driver module 22 outputs a drive voltage to the first gate electrode G1 through the control terminal C. With reference to FIG. 5, the switch circuit 20 is coupled to the external port 10 through the external node $V_{USB}$, and the switch circuit 20 is coupled to the charging conversion chip 30 through the internal node $V_{BUS}$.

The driver module 22 collects a voltage at the reference point R2 (the second electrode D2) in real time. During forward charging (when a charging voltage received by the external node $V_{USB}$ needs to be transmitted to the internal node $V_{BUS}$), that is, when the enhancement-mode bidirectional gallium-nitride high-electron-mobility transistor needs to be turned on and remains the turn-on state, the driver module 22 outputs the first drive voltage based on the voltage at the reference point R2 (the second electrode D2). A difference between the first drive voltage and the collected voltage at the reference point R2 (the second electrode D2) remains a first difference in real time, and the first difference is greater than the threshold voltage of the enhancement-mode bidirectional gallium-nitride high-electron-mobility transistor, in other words, a difference between the voltage of the first gate electrode G1 and the voltage of the second electrode D2 is greater than the threshold voltage of the enhancement-mode bidirectional gallium-nitride high-electron-mobility transistor. In this way, during forward charging, it can be ensured that the enhancement-mode bidirectional gallium-nitride high-electron-mobility transistor is always in the turn-on state, further ensuring normal forward charging.

When charging is completed, and the enhancement-mode bidirectional gallium-nitride high-electron-mobility transistor needs to change into the turn-off state from the turn-on state, the driver module 22 outputs the second drive voltage based on the voltage at the reference point R2 (D2), where a difference between the second drive voltage and the collected voltage at the reference point R2 (D2) remains a second difference in real time, and the second difference is less than the threshold voltage of the enhancement-mode bidirectional gallium-nitride high-electron-mobility transistor, in other words, a difference between the voltage of the first gate electrode G1 and the voltage of the second electrode D2 is less than the threshold voltage of the enhancement-mode bidirectional gallium-nitride high-electron-mobility transistor. In this way, the enhancement-mode bidirectional gallium-nitride high-electron-mobility transistor is turned off.

During reverse charging (when a charging voltage received by the internal node $V_{BUS}$ needs to be transmitted to the external node $V_{USB}$), that is, when the enhancement-mode bidirectional gallium-nitride high-electron-mobility transistor needs to be turned on and remains the turn-on state, the driver module 22 outputs the third drive voltage based on the voltage at the reference point R2 (D2). A difference between the third drive voltage and the collected voltage at the reference point R2 (D2) is a third difference, and the third difference is greater than the threshold voltage of the enhancement-mode bidirectional gallium-nitride high-electron-mobility transistor. Because a maximum value of the voltage at the first electrode D1 is equal to the voltage at the reference point R2 (D2), the difference between the voltage of the first gate electrode G1 and the voltage of the first electrode D1 is definitely greater than the threshold voltage of the enhancement-mode bidirectional gallium-nitride high-electron-mobility transistor. In this way, during reverse charging, it can be ensured that the enhancement-mode bidirectional gallium-nitride high-electron-mobility transistor is always in the turn-on state, further ensuring normal reverse charging.

When charging is completed, if the enhancement-mode bidirectional gallium-nitride high-electron-mobility transistor needs to change into the turn-off state from the turn-on state, the driver module 22 outputs the fourth drive voltage to the first gate electrode G1. The fourth drive voltage may be, for example, 0. Because the fourth drive voltage is 0 V, even if the voltage at the first electrode D1 decreases due to turn-off of the enhancement-mode bidirectional gallium-nitride high-electron-mobility transistor, the voltage at the first electrode D1 is still greater than or equal to 0 V. In other words, the difference between the fourth drive voltage (0 V) and the voltage (greater than or equal to 0 V) of the first electrode D1 is definitely less than or equal to 0, that is, the difference between the voltage of the first gate electrode G1 and the voltage of the first electrode D1 is definitely less than or equal to 0, and is less than the threshold voltage of the enhancement-mode bidirectional gallium-nitride high-electron-mobility transistor. Therefore, the enhancement-mode bidirectional gallium-nitride high-electron-mobility transistor is completely turned off.

As can be learned from the foregoing description, the bidirectional on and off functions can be implemented by disposing only one enhancement-mode bidirectional gallium-nitride high-electron-mobility transistor, and the structure is simple. In addition, the enhancement-mode gallium-nitride high-electron-mobility transistor has a low conductive impedance. Therefore, by disposing the enhancement-mode gallium-nitride high-electron-mobility transistor, a loss and power consumption of the switch circuit can be reduced, and heating can be alleviated. In addition, during forward charging, forward turn-off, and reverse charging, the driver module outputs a drive voltage based on the voltage of the reference point, simplifying an operation process of the driver module.

With reference to the electronic device, the following describes a specific principle of implementing the bidirectional on and off functions of the switch circuit 20 shown in FIG. 4. For example, the charging voltage is 20 V, and the threshold voltage of the enhancement-mode bidirectional gallium-nitride high-electron-mobility transistor is 1.5 V.

For example, with reference to FIG. 2, FIG. 4, and FIG. 5, when the external device connected to the external port 10 is the charger 200, that is, when the charger 200 needs to charge the mobile phone 100, in other words, when the charging voltage received by the external node $V_{USB}$ needs to be transmitted to the internal node $V_{BUS}$, the enhancement-mode bidirectional gallium-nitride high-electron-mobility transistor needs to change into the turn-on state from the turn-off state. When the enhancement-mode bidirectional gallium-nitride high-electron-mobility transistor is in the turn-off state, the voltage at the external node $V_{USB}$ is the charging voltage 20 V. In this case, the internal node $V_{BUS}$ is 0 V, the voltage at the first electrode D1 is the same as the voltage at the external node $V_{USB}$, and the voltages of the first gate electrode G1, the second electrode D2, and the reference point R2 are the same as the voltage of the internal node $V_{BUS}$. To turn on the enhancement-mode bidirectional gallium-nitride high-electron-mobility transistor, the driver module 22 collects the voltage of the reference point R2 (the same as the voltage at the second electrode D2) in real time, and performs operation based on the reference point R2, so that the difference between the output first drive voltage and the collected voltage of the reference point R2 remains the first difference 5 V in real time. Therefore, when the voltage of the reference point R2 collected by the driver module 22 is 0 V, the driver module 22 sends the first drive voltage, which is 5 V, to the first gate electrode G1. In this case, the difference between the voltage (5 V) of the first gate electrode G1 and the voltage (0 V) of the second electrode D2 is 5 V, which is greater than the threshold voltage 1.5 V of the enhancement-mode bidirectional gallium-nitride high-electron-mobility transistor, and the enhancement-mode bidirectional gallium-nitride high-electron-mobility transistor is turned on. The voltage of the second electrode D2 gradually increases from 0 V to 20 V. The driver module 22 collects the voltage of the reference point R2 (the second electrode D2) in real time, and adjusts in real time, based on the collected voltage of the reference point R2 (the second electrode D2), the first drive voltage output to the first gate electrode G1. The difference between the first drive voltage and the voltage of the reference point R2 (the second electrode D2) always remains the first difference 5 V. Therefore, when the voltage of the reference point R2 (the second electrode D2) gradually increases to 20 V, the driver module 22 also gradually adjusts the output first drive voltage from 5 V to 25 V based on the voltage of the reference point R2 (the second electrode D2) in real time. In this way, the voltage difference between the first gate electrode G1 and the second electrode D2 remains 5 V, that is, is greater than the threshold voltage 1.5 V of the enhancement-mode bidirectional gallium-nitride high-electron-mobility transistor, so that during charging, the enhancement-mode bidirectional gallium-nitride high-electron-mobility transistor is always in the turn-on state. The charging voltage 20 V of the external node $V_{USB}$ is transmitted to the internal node $V_{BUS}$ by turning on the enhancement-mode bidirectional gallium-nitride high-electron-mobility transistor, so as to be transmitted to the charging conversion chip 30 through the internal node $V_{BUS}$. The charging conversion chip 30 converts the charging voltage, and outputs the converted voltage to the battery 40 to charge the battery 40. In addition, the converted voltage is transmitted to the system-on-a-chip (SoC) 50 to power the CPU, the GPU, the modem, and the like that are integrated in the system-on-a-chip (SoC) 50, ensuring normal operation of the CPU, the GPU, and the modem.

When charging is completed or a large voltage causes an exception such as damage of the mobile phone 100 during charging, the enhancement-mode bidirectional gallium-nitride high-electron-mobility transistor needs to change into the turn-off state from the turn-on state. When the enhancement-mode bidirectional gallium-nitride high-electron-mobility transistor is in the turn-on state, voltages of the external node $V_{USB}$, the internal node $V_{BUS}$, the first electrode D1, the second electrode D2, and the reference point R2 are all the charging voltage 20 V, and the voltage of the first gate electrode G1 is 25 V. To turn off the enhancement-mode bidirectional gallium-nitride high-electron-mobility transistor, the driver module 22 collects the voltage of the reference point R2 (the same as the voltage at the second electrode D2) in real time, and performs operation based on the reference point R2, so that the difference between the output first drive voltage and the collected voltage of the reference point R2 remains the second difference 0 V in real time. Therefore, when the voltage of the reference point R2 collected by the driver module 22 is 20 V, the driver module 22 sends the second drive voltage, which is 20 V, to the first gate electrode G1. In this case, the difference between the voltage of the first gate electrode G1 and the voltage of the second electrode D2 is 0 V, which is less than the threshold voltage 1.5 V of the enhancement-mode bidirectional gallium-nitride high-electron-mobility transistor, and the enhancement-mode bidirectional gallium-nitride high-electron-mobility transistor is turned off. In addition, the driver module 22 collects the voltage of the reference point R2 (the second electrode D2) in real time, and adjusts in real time, based on the collected voltage of the reference point R2 (the second electrode D2), the second drive voltage output to the first gate electrode G1. The difference between the second drive voltage and the voltage of the reference point R2 (the second electrode D2) always remains the second difference 0 V. Even if the voltage of the reference point R2 (the second electrode D2) decreases to 0 V after the enhancement-mode bidirectional gallium-nitride high-electron-mobility transistor is turned off, the second drive voltage output by the driver module 22 also decreases accordingly, so that the voltage difference between the first gate electrode G1 and the second electrode D2 of the first switch module 21 remains 0 V, ensuring that the enhancement-mode bidirectional gallium-nitride high-electron-mobility transistor is always in the turn-off state. In this way, the charging voltage that is output by the charger 200 cannot be transmitted to the charging conversion chip 30. The charging conversion chip 30 cannot supply power to the battery 40, and the CPU, the GPU, the modem, and the like that are integrated in the system-on-a-chip (SoC) 50.

For example, with reference to FIG. 3, FIG. 4, and FIG. 5, when the external device connected to the external port 10 is a to-be-charged mobile phone 300, that is, when the mobile phone 100 needs to charge the to-be-charged mobile phone 300, in other words, when the charging voltage received by the internal node $V_{BUS}$ needs to be transmitted to the external node $V_{USB}$, the enhancement-mode bidirectional gallium-nitride high-electron-mobility transistor needs to change into the turn-on state from the turn-off state. When the enhancement-mode bidirectional gallium-nitride high-electron-mobility transistor is in the turn-off state, the voltage at the internal node $V_{BUS}$ is the charging voltage 20 V. In this case, the external node $V_{USB}$ is 0 V, the voltage of the first electrode D1 is the same as the voltage of the external node $V_{USB}$, and voltages the reference point R2 and the second electrode D2 are equal to the voltage at the internal node $V_{BUS}$. To turn on the enhancement-mode bidirectional gallium-nitride high-electron-mobility transistor, the driver module 22 collects the voltage of the reference point R2 (the second electrode D2) in real, and performs operation based on the reference point R2 (the second electrode D2), so that the difference between the output third drive voltage and the collected voltage of the reference point R2 remains the third difference 5 V in real time. Therefore, when the voltage of the reference point R2 collected by the driver module 22 is 20 V, the driver module 22 sends the third drive voltage, which is 25 V, to the first gate electrode G1 through the control terminal C. In this case, the difference between the voltage (25 V) of the first gate electrode G1 and the voltage (0 V) of the first electrode D1 is 25 V, which is greater than the threshold voltage 1.5 V of the enhancement-mode bidirectional gallium-nitride high-electron-mobility transistor, and the enhancement-mode bidirectional gallium-nitride high-electron-mobility transistor is turned on. The voltage of the first electrode D1 gradually increases from 0 V to 20 V. Because the voltage of the reference point R2 (the second electrode D2) always remains 20 V, the driver module 22 keeps sending the third drive voltage 25 V to the first gate electrode G1. The voltage difference between the third drive voltage (25 V) and the first electrode D1 (the maximum value is 20 V) is greater than or equal to 5 V, which is greater than the threshold voltage 1.5 V of the enhancement-mode bidirectional gallium-nitride high-electron-mobility transistor, so that during charging, the enhancement-mode bidirectional gallium-nitride high-electron-mobility transistor is always in the turn-on state, ensuring normal charging.

When charging is completed or a large voltage causes an exception such as damage of the to-be-charged mobile phone 300 during charging, the enhancement-mode bidirectional gallium-nitride high-electron-mobility transistor needs to change into the turn-off state from the turn-on state. When the enhancement-mode bidirectional gallium-nitride high-electron-mobility transistor is in the turn-on state, voltages of the internal node $V_{BUS}$, the external node VUSB, the first electrode D1, the second electrode D2, and the reference point R2 are all the charging voltage 20 V. For example, the voltage of the first gate electrode G1 is 25 V. To turn off the enhancement-mode bidirectional gallium-nitride high-electron-mobility transistor, the driver module 22 cannot perform operation based on the reference point R2, so that the difference between the output fourth drive voltage and the voltage of the reference point R2 remains the fourth difference 0 V, in other words, the fourth drive voltage is equal to the voltage of the reference point R2. If the driver module 22 outputs the fourth drive voltage based on the voltage of the reference point R2, because the voltages of both the reference point R2 and the internal node $V_{BUS}$ are 20 V, the fourth drive voltage output by the driver module 22 is 20 V. Further, the voltage of the first electrode D1 gradually decreases due to turn-off of the enhancement-mode bidirectional gallium-nitride high-electron-mobility transistor. For example, when the voltage of the first electrode D1 decreases to 15 V, the difference between the first gate electrode G1 (20 V) and the first electrode D1 (15 V) is 5 V, the enhancement-mode bidirectional gallium-nitride high-electron-mobility transistor is turned on, and the enhancement-mode bidirectional gallium-nitride high-electron-mobility transistor cannot be turned off. Therefore, to prevent the enhancement-mode bidirectional gallium-nitride high-electron-mobility transistor from being turned on in the turn-off process, in this embodiment, the driver module 22 outputs the fourth drive voltage 0 V. When the driver module 22 outputs the fourth drive voltage 0 V to the first gate electrode G1, even if the voltage at the first electrode D1 decreases, the voltage at the first electrode D1 is still greater than or equal to 0 V. In other words, the difference between the voltage (0 V) of the first gate electrode G1 and the voltage (greater than or equal to 0 V) of the first electrode D1 is definitely less than or equal to 0, and is less than the threshold voltage 1.5 V of the enhancement-mode bidirectional gallium-nitride high-electron-mobility transistor. Therefore, the enhancement-mode bidirectional gallium-nitride high-electron-mobility transistor is completely turned off.

Figure 6:
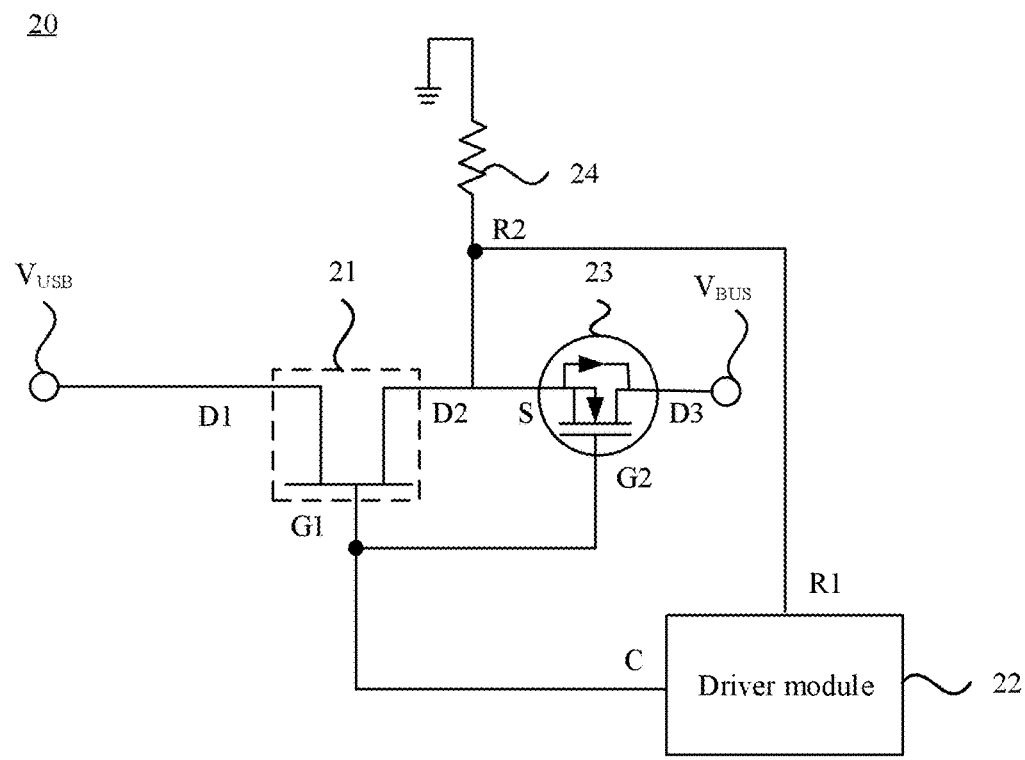
FIG. 6 is a schematic structural diagram of another switch circuit according to an embodiment of this application.

In another example, as shown in FIG. 6, a difference from the foregoing example is that the switch circuit 20 further includes a second switch module 23. The second switch module 23 is coupled between the second electrode D2 and the internal node $V_{BUS}$. The second switch module 23 includes a MOSFET, for example, may include an NMOSFET. The NMOSFET includes a second gate electrode G2, a source electrode S, and a drain electrode D3. The source electrode S of the second switch module 23 is coupled to the second electrode D2 of the first switch module 21. The drain electrode D3 of the second switch module 23 is coupled to the internal node $V_{BUS}$. The second gate electrode G2 of the second switch module 23 is coupled to the first gate electrode G1 of the first switch module 21.

By disposing the second switch module 23, the reference point R2 may be spaced from the internal node $V_{BUS}$. In this way, during forward charging, forward turn-off, and reverse charging, the driver module 22 outputs a drive voltage based on the voltage of the reference point R2, so that the first switch module 21 is turned on during forward charging and reverse charging, and is turned off during forward turn-off. Moreover, during reverse turn-off, the driver module 22 can output a drive voltage based on the voltage of the reference point R2, so that the first switch module 21 is completely turned off during reverse turn-off. In other words, at different stages, the driver module 22 outputs the drive voltage based on the voltage of the reference point R2. In this way, the operation process of the driver module is further simplified. In addition, in this embodiment, the switch circuit 20 includes the enhancement-mode bidirectional gallium-nitride high-electron-mobility transistor and the NMOSFET. However, because the enhancement-mode bidirectional gallium-nitride high-electron-mobility transistor has a low conductive impedance, compared with two MOSFETs, a conductive impedance of the switch circuit 20 in this embodiment is reduced. It is concluded after verification that the conductive impedance of the switch circuit 20 including the enhancement-mode bidirectional gallium-nitride high-electron-mobility transistor and the NMOSFET can be reduced by 25% compared with that of the switch circuit including two MOSFETs. In this way, a switching loss and power consumption can be reduced, and heating can be alleviated.

In addition, still as shown in FIG. 6, the switch circuit 20 further includes a resistor 24. One terminal of the resistor 24 is coupled to the reference point R2, and the other terminal of the resistor 24 is grounded. By disposing the resistor 24, during forward turn-off and reverse turn-off, the voltage of the reference point R2 can decrease to 0 V rapidly, and the voltage of the driver module 22 can also decrease to 0 V rapidly based on the voltage of the reference point R2, in other words, charges in the enhancement-mode bidirectional gallium-nitride high-electron-mobility transistor and the NMOSFET are discharged rapidly. Further, the enhancement-mode bidirectional gallium-nitride high-electron-mobility transistor and the NMOSFET are turned off rapidly.

For example, the resistance of the resistor 24 is greater than 100 kilohms. The resistance of the resistor 24 is greater than 100 kilohms. In this way, when the reference point R2 discharges to the ground, a current will not be too large. In addition, the voltage of the reference point R2 can decrease to 0 V rapidly.

Figure 7:
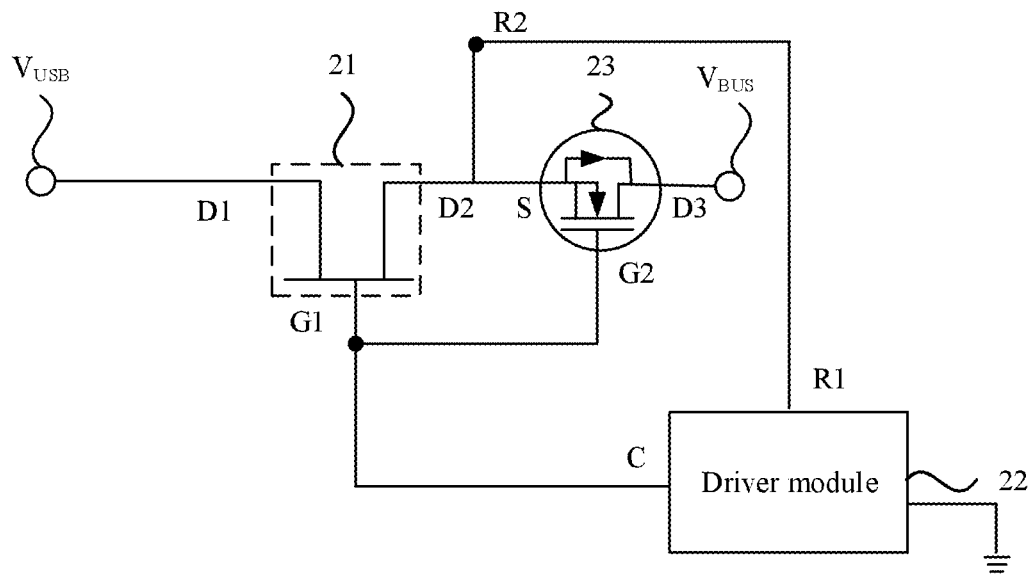
FIG. 7 is a schematic structural diagram of another switch circuit according to an embodiment of this application.

It should be noted that in the foregoing example, the switch circuit 20 is provided with the resistor 24, and one terminal of the resistor 24 is grounded, but this does not constitute a limitation on this application. Optionally, to rapidly turn off the enhancement-mode bidirectional gallium-nitride high-electron-mobility transistor and the NMOSFET, as shown in FIG. 7, the reference terminal R1 of the driver module 22 may further be grounded. The reference terminal R1 is grounded, so that the voltage of the reference point R2 decreases to 0 V rapidly, and the driver module 22 also decreases to 0 V rapidly based on the voltage of the reference point R2.

With reference to the electronic device, the following describes a specific principle of implementing the bidirectional on and off functions of the switch circuit 20 shown in FIG. 6. An example in which the second switch module 23 is an NMOSFET, and a threshold voltage of the NMOSFET is 2 V is used for description.

Figure 8:
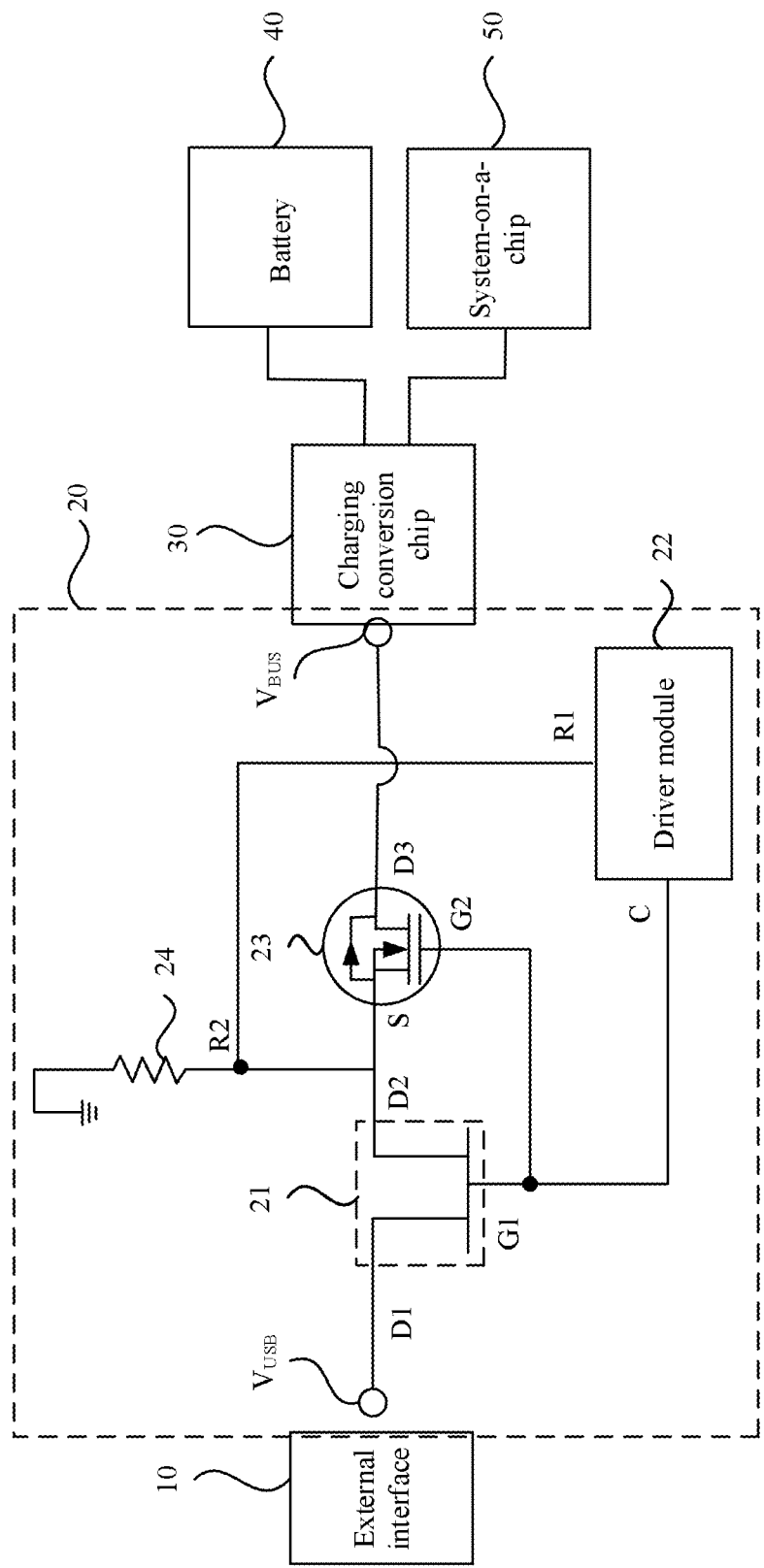
FIG. 8 is a schematic structural diagram of another electronic device according to an embodiment of this application.
Figure 9:
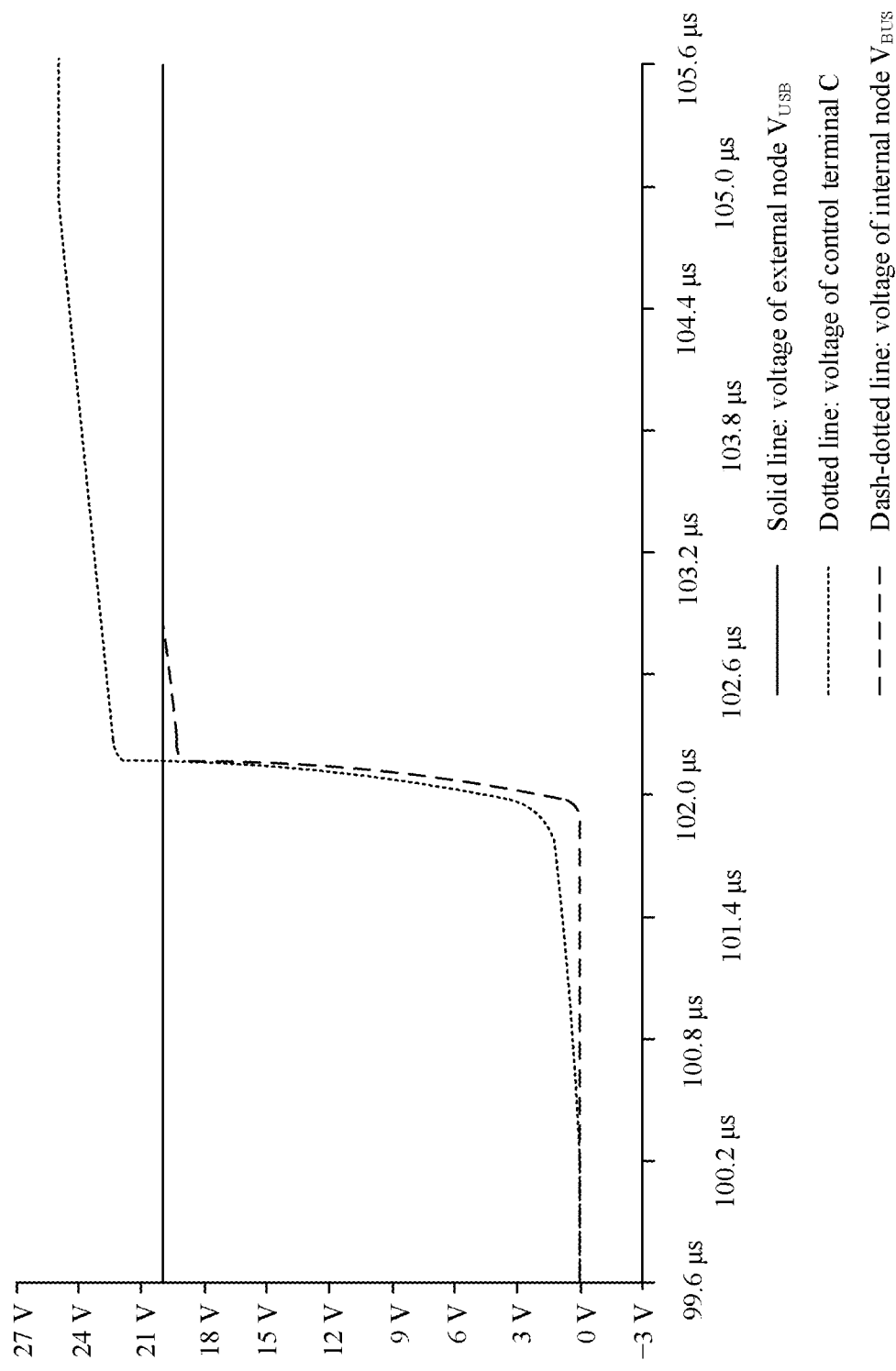
FIG. 9 is a simulation diagram during forward charging according to an embodiment of this application.

FIG. 9 is a simulation diagram during forward charging according to an embodiment. With reference to FIG. 2, FIG. 8, and FIG. 9, when the external device connected to the external port 10 is the charger 200, that is, when the charger 200 needs to charge the mobile phone 100, in other words, when the charging voltage received by the external node $V_{USB}$ needs to be transmitted to the internal node $V_{BUS}$, the enhancement-mode bidirectional gallium-nitride high-electron-mobility transistor and the NMOSFET need to change into the turn-on state from the turn-off state.

At the turn-off stage, that is, before 100 μs in FIG. 9, the enhancement-mode bidirectional gallium-nitride high-electron-mobility transistor and the NMOSFET are both turned off, and the voltage at the external node $V_{USB}$ is the charging voltage 20 V. In this case, the voltage of the internal node $V_{BUS}$ is 0 V, the voltages of the first gate electrode G1 and the second gate electrode G2 are also 0 V, and the voltages of the reference point R2, the second electrode D2, and the source electrode S are the same as that of the internal node $V_{BUS}$.

At the turn-on stage, to turn on the enhancement-mode bidirectional gallium-nitride high-electron-mobility transistor and the NMOSFET, the driver module 22 collects the voltage of the reference point R2 (the same as the voltage at the second electrode D2) in real time, and performs operation based on the reference point R2, so that the difference between the output first drive voltage and the collected voltage of the reference point R2 remains the first difference 5 V in real time. Therefore, when the voltage of the reference point R2 collected by the driver module 22 is 0 V, the driver module 22 gradually increases the first drive voltage applied to the first gate electrode G1 and the second gate electrode G2 to 5 V at 100 μs. As can be learned from FIG. 9, at 101.8 μs, the first drive voltage applied to the first gate electrode G1 and the second gate electrode G2 begins to become greater than 2 V. To be specific, when the voltage difference between the first gate electrode G1 (greater than 2 V) and the second electrode D2 (0 V) is greater than the threshold voltage 1.5 V of the enhancement-mode bidirectional gallium-nitride high-electron-mobility transistor, the enhancement-mode bidirectional gallium-nitride high-electron-mobility transistor is turned on; and when the voltage difference between the second gate electrode G1 (greater than 2 V) and the source electrode S (0 V) is greater than the threshold voltage 2 V of the NMOSFET, the NMOSFET is turned on, and a voltage begins to appear at the internal node $V_{BUS}$.

At the increase stage, that is, between 101.8 μs and 105 μs, after the enhancement-mode bidirectional gallium-nitride high-electron-mobility transistor and the NMOSFET are both turned on, the voltage at the internal node $V_{BUS}$ increases from 0 V to 20 V. Certainly, the voltage at the reference point R2 also increases from 0 V to 20 V. The driver module 22 collects the voltage of the reference point R2 (the same as the voltage at the second electrode D2) in real time, and performs operation based on the reference point R2, so that the difference between the output first drive voltage and the collected voltage of the reference point R2 remains the first difference 5 V in real time. Therefore, when the voltage at the reference point R2 also increases from 0 V to 20 V, the first drive voltage output by the control terminal C of the driver module 22 gradually increases to 25 V accordingly.

At the stage after turn-on, that is, after 105 μs, the voltage at the internal node $V_{BUS}$ and the voltage at the reference point R2 both remain 20 V, and the first drive voltage output by the control terminal C of the driver module 22 also remains 25 V. In this way, the voltage difference between the first gate electrode G1 (25 V) and the second electrode D2 (20 V) remains 5 V, that is, is greater than the threshold voltage 1.5 V of the enhancement-mode bidirectional gallium-nitride high-electron-mobility transistor. The voltage difference between the second gate electrode G2 (25 V) and the source electrode S (20 V) remains 5 V, that is, is greater than the threshold voltage 2 V of the NMOSFET. During charging, the enhancement-mode bidirectional gallium-nitride high-electron-mobility transistor and the NMOSFET are always in the turn-on state. The charging voltage 20 V of the external node $V_{USB}$ is transmitted to the internal node $V_{BUS}$ by turning on the enhancement-mode bidirectional gallium-nitride high-electron-mobility transistor, so as to be transmitted to the charging conversion chip 30 through the internal node $V_{BUS}$. The charging conversion chip 30 converts the charging voltage, and outputs the converted voltage to the battery 40 to charge the battery 40. In addition, the converted voltage is transmitted to the system-on-a-chip (SoC) 50 to power the CPU, the GPU, the modem, and the like that are integrated in the system-on-a-chip (SoC) 50, ensuring normal operation of the CPU, the GPU, and the modem.

Figure 10:
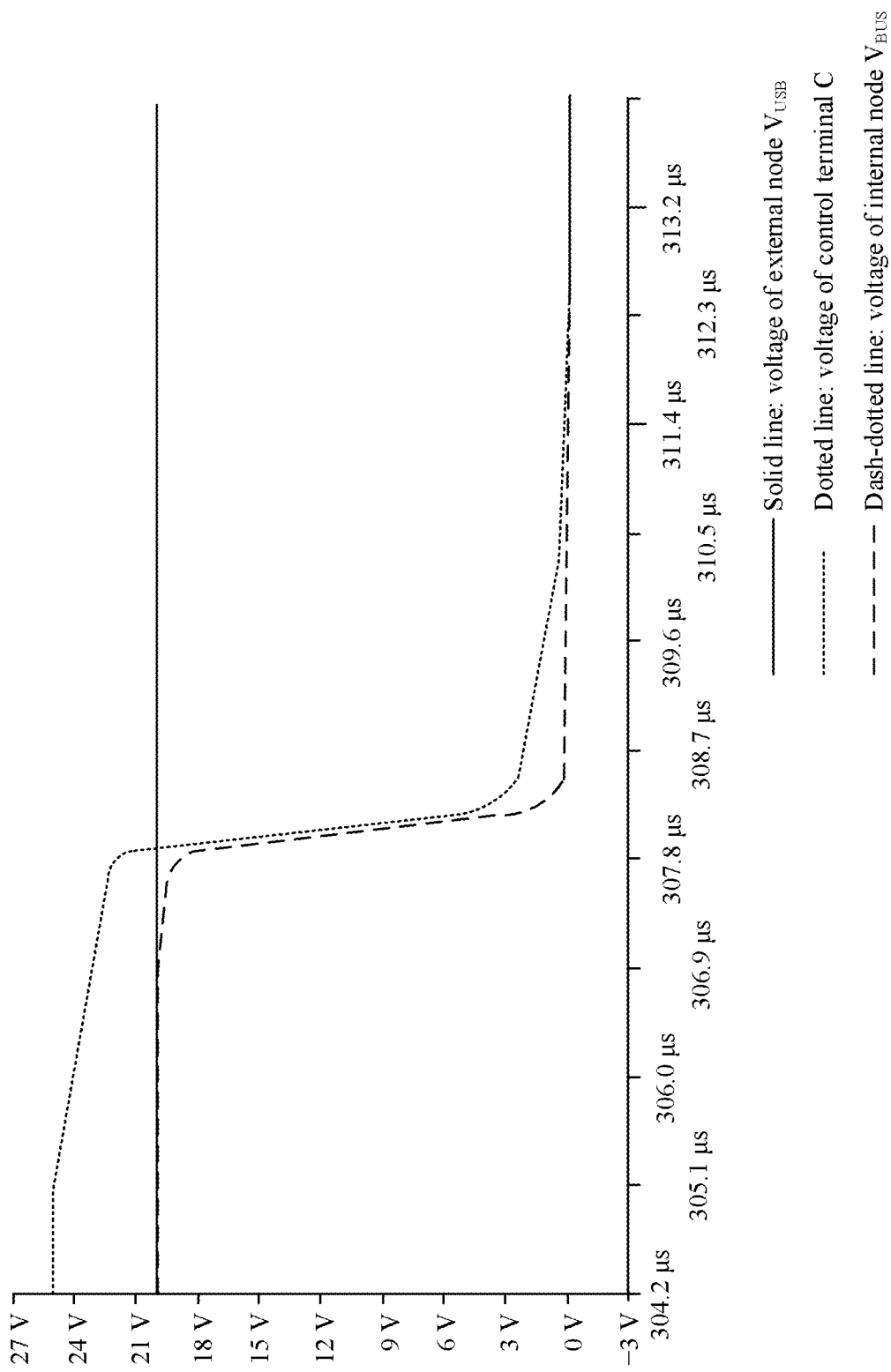
FIG. 10 is a simulation diagram during forward turn-off according to an embodiment of this application.

FIG. 10 is a simulation diagram during forward turn-off according to an embodiment. With reference to FIG. 2, FIG. 8, and FIG. 10, when charging is completed or a large voltage causes an exception such as damage of the mobile phone 100 during charging, the enhancement-mode bidirectional gallium-nitride high-electron-mobility transistor and the NMOSFET need to change into the turn-off state from the turn-on state.

At the turn-on stage, that is, before 305 µs in FIG. 10, the enhancement-mode bidirectional gallium-nitride high-electron-mobility transistor and the NMOSFET are both turned on, and the voltages of the external node $V_{USB}$, the internal node $V_{BUS}$, the second electrode D2, the source electrode S, the drain electrode D3, and the reference point R2 are all the charging voltage 20 V. The voltages of the first gate electrode G1 and the second gate electrode G2 are 25 V.

At the turn-off stage, to turn off the enhancement-mode bidirectional gallium-nitride high-electron-mobility transistor and the NMOSFET, the driver module 22 collects the voltage of the reference point R2 (the same as the voltage at the second electrode D2) in real time, and performs operation based on the reference point R2, so that the difference between the output second drive voltage and the collected voltage of the reference point R2 remains the second difference 0 V in real time. Therefore, at 305 µs, the second drive voltage output by the driver module 22 gradually decreases to 20 V. As can be learned from FIG. 10, at 307.4 µs, the second drive voltage applied to the first gate electrode G1 and the second gate electrode G2 decreases to 21.5 V. To be specific, when the voltage difference between the first gate electrode G1 (21.5 V) and the second electrode D2 (20 V) is equal to the threshold voltage 1.5 V of the enhancement-mode bidirectional gallium-nitride high-electron-mobility transistor, and the voltage difference between the second gate electrode G1 (21.5 V) and the source electrode S (20 V) is less than the threshold voltage 2 V of the NMOSFET, the enhancement-mode bidirectional gallium-nitride high-electron-mobility transistor and the NMOSFET begin to turn off, and the voltage at the internal node $V_{BUS}$ begins to decrease.

At the decrease stage, that is, between 307.4 µs and 312.3 µs, the enhancement-mode bidirectional gallium-nitride high-electron-mobility transistor and the NMOSFET cannot be turned off immediately. Therefore, the voltage at the internal node $V_{BUS}$ gradually decreases from 20 V to 0 V. Certainly, the voltage at the reference point R2 also gradually decreases from 20 V to 0 V. The driver module 22 collects the voltage of the reference point R2 in real time, and performs operation based on the reference point R2, so that the difference between the output second drive voltage and the collected voltage of the reference point R2 remains the second difference 0 V in real time. Therefore, when the voltage at the reference point R2 decreases from 20 V to 0 V, the second drive voltage output by the control terminal C of the driver module 22 also gradually decreases to 0 V accordingly.

At the stage after turn-off, that is, after 312.3 µs, the voltages at both the internal node $V_{BUS}$ and the reference point R2 remain 0 V, and the second drive voltage output by the control terminal C of the driver module 22 also remains 0 V. In this way, the voltage difference between the first gate electrode G1 (0 V) and the second electrode D2 (0 V) remains 0 V, that is, is less than the threshold voltage 1.5 V of the enhancement-mode bidirectional gallium-nitride high-electron-mobility transistor. The voltage difference between the second gate electrode G2 (0 V) and the source electrode S (0 V) remains 0 V, that is, is less than the threshold voltage 2 V of the NMOSFET, so that the enhancement-mode bidirectional gallium-nitride high-electron-mobility transistor and the NMOSFET are always in the turn-off state. The charging voltage that is output by the charger 200 cannot be transmitted to the charging conversion chip 30. The charging conversion chip 30 cannot supply power to the battery 40, and the CPU, the GPU, the modem, and the like that are integrated in the system-on-a-chip (SoC) 50.

Figure 11:
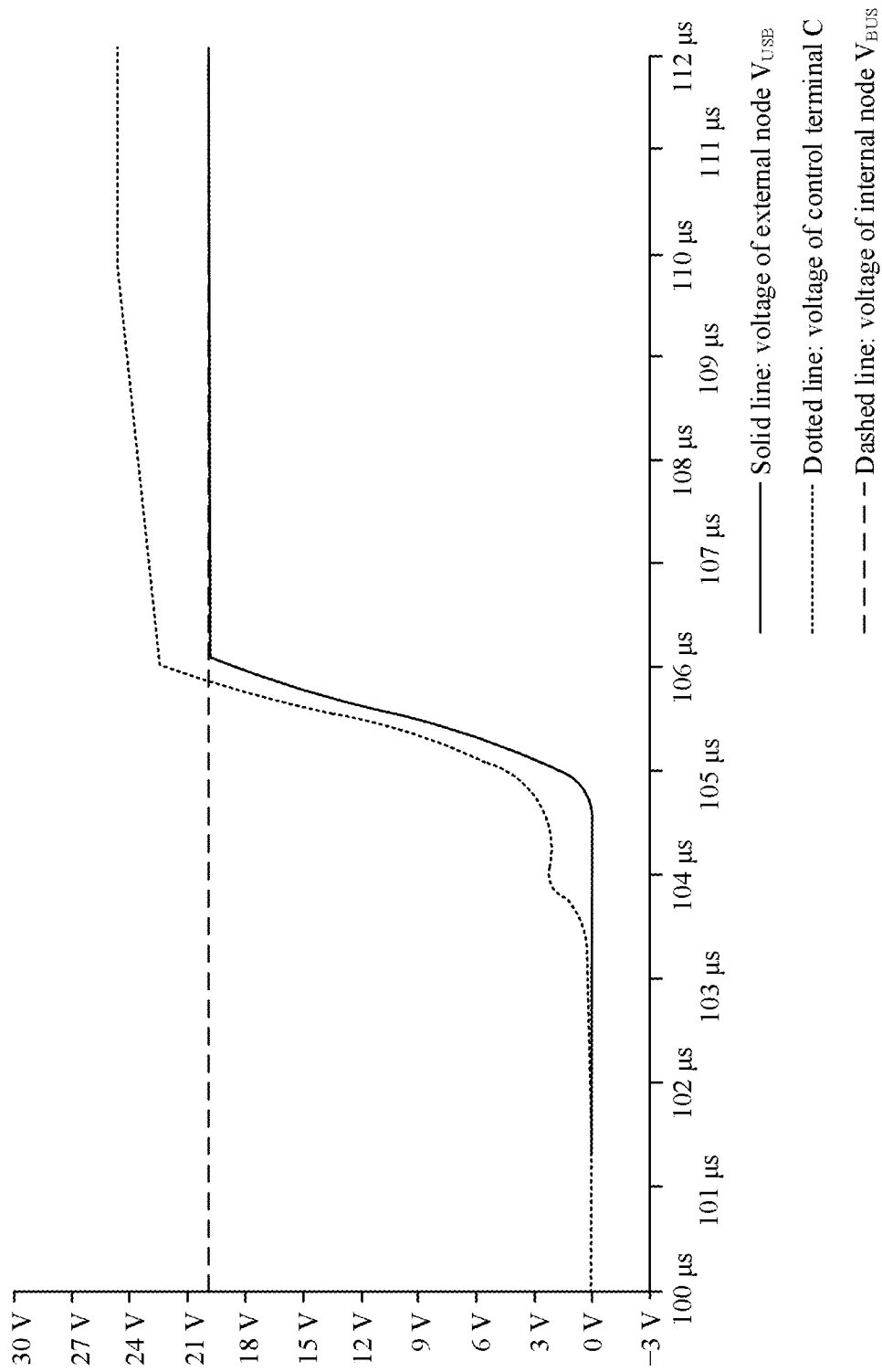
FIG. 11 is a simulation diagram during reverse charging according to an embodiment of this application.

FIG. 11 is a simulation diagram during reverse charging according to an embodiment. With reference to FIG. 3, FIG. 8, and FIG. 11, when the external device connected to the external port 10 is a to-be-charged mobile phone 300, that is, when the mobile phone 100 needs to charge the to-be-charged mobile phone 300, in other words, when the charging voltage received by the internal node $V_{BUS}$ needs to be transmitted to the external node $V_{USB}$, the enhancement-mode bidirectional gallium-nitride high-electron-mobility transistor and the NMOSFET need to change into the turn-on state from the turn-off state.

At the turn-off stage, that is, before 101 µs in FIG. 11, the enhancement-mode bidirectional gallium-nitride high-electron-mobility transistor and the NMOSFET are both turned off, and the voltage at the internal node $V_{BUS}$ is the charging voltage 20 V. In this case, the voltage of the external node $V_{USB}$ is 0 V, the voltages of the first gate electrode G1 and the second gate electrode G2 are also 0 V, and the voltages of the reference point R2, the second electrode D2, and the source electrode S are the same as that of the external node $V_{USB}$.

At the turn-on stage, to turn on the enhancement-mode bidirectional gallium-nitride high-electron-mobility transistor and the NMOSFET, the driver module 22 collects the voltage of the reference point R2 (the same as the voltage at the second electrode D2) in real time, and performs operation based on the reference point R2, so that the difference between the output third drive voltage and the collected voltage of the reference point R2 remains the third difference 5 V in real time. Therefore, when the voltage of the reference point R2 collected by the driver module 22 is 0 V, the driver module 22 gradually increases the first drive voltage applied to the first gate electrode G1 and the second gate electrode G2 to 5 V at 101 µs. As can be learned from FIG. 11, at 104.5 µs, the first drive voltage applied to the first gate electrode G1 and the second gate electrode G2 begins to become greater than 2 V. To be specific, when the voltage difference between the first gate electrode G1 (greater than 2 V) and the first electrode D1 (0 V) is greater than the threshold voltage 1.5 V of the enhancement-mode bidirectional gallium-nitride high-electron-mobility transistor, the enhancement-mode bidirectional gallium-nitride high-electron-mobility transistor is turned on; and when the voltage difference between the second gate electrode G1 (greater than 2 V) and the source electrode S (0 V) is greater than the threshold voltage 2 V of the NMOSFET, the NMOSFET is turned on, and a voltage begins to appear at the external node $V_{USB}$.

At the increase stage, that is, between 104.5 µs and 105 µs, after the enhancement-mode bidirectional gallium-nitride high-electron-mobility transistor and the NMOSFET are both turned on, the voltage at the external node $V_{USB}$ increases from 0 V to 20 V. Certainly, the voltage at the reference point R2 also increases from 0 V to 20 V. The driver module 22 collects the voltage of the reference point R2 in real time, and performs operation based on the reference point R2, so that the difference between the output third drive voltage and the collected voltage of the reference point R2 remains the third difference 5 V in real time. Therefore, when the voltage at the reference point R2 also increases from 0 V to 20 V, the third drive voltage output by the control terminal C of the driver module 22 also gradually increases to 25 V accordingly.

At the stage after turn-on, that is, after 110 µs, the voltage at the external node $V_{USB}$ and the voltage at the reference point R2 both remain 20 V, and the third drive voltage output by the control terminal C of the driver module 22 also remains 25 V. In this way, the voltage difference between the first gate electrode G1 (25 V) and the first electrode D1 (20 V) remains 5 V, that is, is greater than the threshold voltage 1.5 V of the enhancement-mode bidirectional gallium-nitride high-electron-mobility transistor. The voltage difference between the second gate electrode G2 (25 V) and the source electrode S (20 V) remains 5 V, that is, is greater than the threshold voltage 2 V of the NMOSFET. During charging, the enhancement-mode bidirectional gallium-nitride high-electron-mobility transistor and the NMOSFET are always in the turn-on state, ensuring normal charging.

Figure 12:
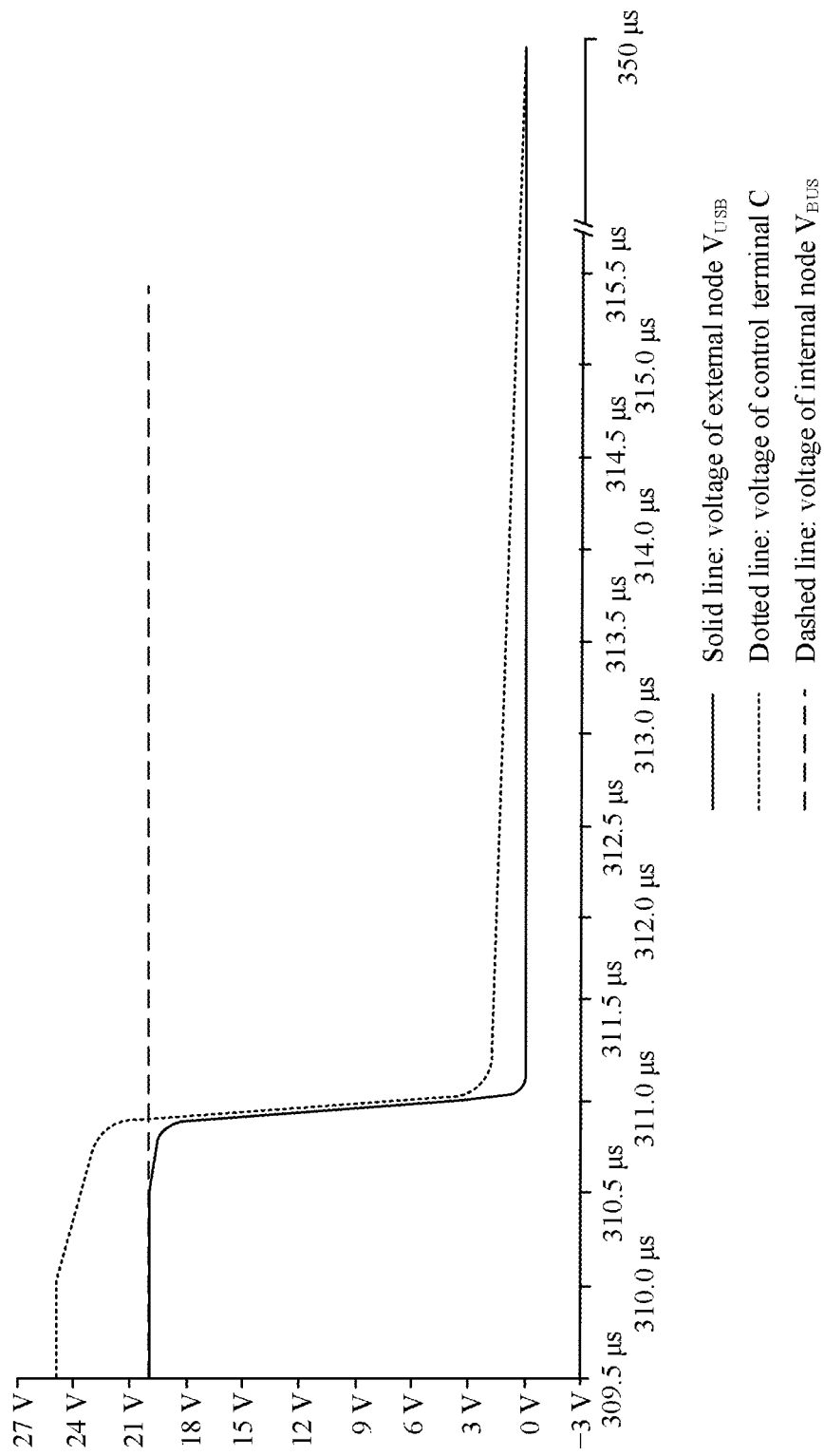
FIG. 12 is a simulation diagram during reverse turn-off according to an embodiment of this application.

FIG. 12 is a simulation diagram during reverse turn-off according to an embodiment. With reference to FIG. 3, FIG. 8, and FIG. 12, when charging is completed or a large voltage causes an exception such as damage of the mobile phone 100 during charging, the enhancement-mode bidirectional gallium-nitride high-electron-mobility transistor and the NMOSFET need to change into the turn-off state from the turn-on state.

At the turn-on stage, that is, before 310 µs in FIG. 12, the enhancement-mode bidirectional gallium-nitride high-electron-mobility transistor and the NMOSFET are both turned on, and the voltages of the external node $V_{USB}$, the internal node $V_{BUS}$, the second electrode D2, the source electrode S, the drain electrode D3, and the reference point R2 are all the charging voltage 20 V. The voltages of the first gate electrode G1 and the second gate electrode G2 are 25 V.

At the turn-off stage, to turn off the enhancement-mode bidirectional gallium-nitride high-electron-mobility transistor and the NMOSFET, the driver module 22 collects the voltage of the reference point R2 (the same as the voltage at the second electrode D2) in real time, and performs operation based on the reference point R2, so that the difference between the output fourth drive voltage and the collected voltage of the reference point R2 remains the fourth difference 0 V in real time. Therefore, at 310 µs, the fourth drive voltage output by the driver module 22 gradually decreases to 20 V. As can be learned from FIG. 12, at 310.7 µs, the fourth drive voltage applied to the first gate electrode G1 and the second gate electrode G2 decreases to 21.5 V. To be specific, when the voltage difference between the first gate electrode G1 (21.5 V) and the first electrode D1 (20 V) is equal to the threshold voltage 1.5 V of the enhancement-mode bidirectional gallium-nitride high-electron-mobility transistor, and the voltage difference between the second gate electrode G1 (21.5 V) and the source electrode S (20 V) is less than the threshold voltage 2 V of the NMOSFET, the enhancement-mode bidirectional gallium-nitride high-electron-mobility transistor and the NMOSFET begin to turn off, and the voltage at the internal node $V_{BUS}$ begins to decrease from 20 V.

At the decrease stage, that is, between 310.7 µs and 350 µs, the enhancement-mode bidirectional gallium-nitride high-electron-mobility transistor and the NMOSFET cannot be turned off immediately. Therefore, the voltage at the internal node $V_{BUS}$ gradually decreases from 20 V to 0 V. Certainly, the voltage at the reference point R2 also gradually decreases from 20 V to 0 V. The driver module 22 collects the voltage of the reference point R2 in real time, and performs operation based on the reference point R2, so that the difference between the output fourth drive voltage and the collected voltage of the reference point R2 remains the fourth difference 0 V in real time. Therefore, when the voltage at the reference point R2 decreases from 20 V to 0 V, the fourth drive voltage output by the control terminal C of the driver module 22 also gradually decreases to 0 V accordingly.

At the stage after turn-off, that is, after 350 µs, the voltages at both the internal node $V_{BUS}$ and the reference point R2 remain 0 V, and the fourth drive voltage output by the control terminal C of the driver module 22 also remains 0 V. In this way, the voltage difference between the first gate electrode G1 (0 V) and the first electrode D1 (0 V) remains 0 V, that is, is less than the threshold voltage 1.5 V of the enhancement-mode bidirectional gallium-nitride high-electron-mobility transistor. The voltage difference between the second gate electrode G2 (0 V) and the source electrode S (0 V) remains 0 V, that is, is less than the threshold voltage 2 V of the NMOSFET, so that the enhancement-mode bidirectional gallium-nitride high-electron-mobility transistor and the NMOSFET are always in the turn-off state. Therefore, the enhancement-mode bidirectional gallium-nitride high-electron-mobility transistor is completely turned off.

Figure 13:
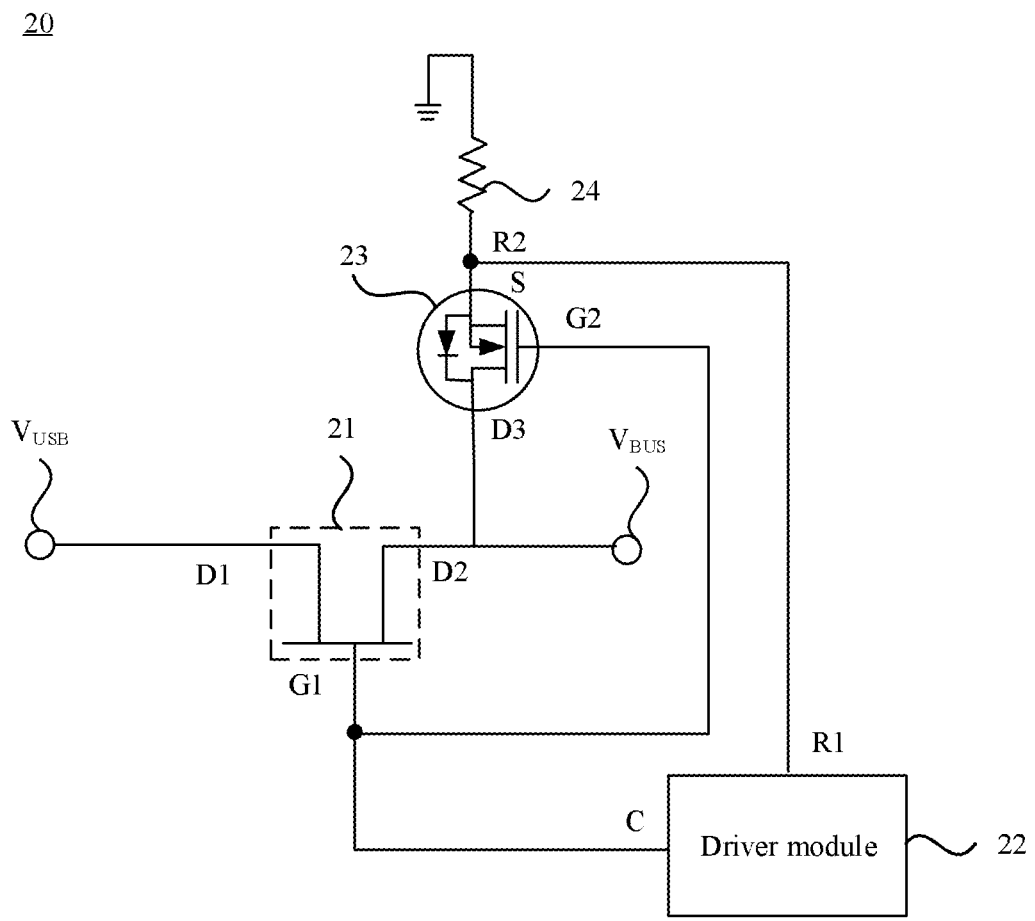
FIG. 13 is a schematic structural diagram of another switch circuit according to an embodiment of this application.

In still another example, as shown in FIG. 13, a difference from the foregoing example is that the second switch module 23 is disposed at a different position. Specifically, the drain electrode D3 of the second switch module 23 is separately coupled to the second electrode D2 of the first switch module 21 and the internal node $V_{BUS}$, the source electrode S of the second switch module 23 is coupled to the reference point R2, and the second gate electrode G2 of the second switch module 23 is coupled to the first gate electrode G1 of the first switch module 21.

Because the second switch module 23 is not located in the charging path, the second switch module 23 may be, for example, a low-power MOSFET such as an Si NMOSFET. For example, a range of a conductive impedance of the second switch module 22 is greater than or equal to 1 ohm and less than or equal to 100 ohms; a withstand voltage range from the gate electrode to the source electrode of the second switch module 22 is greater than or equal to 5 V and less than or equal to 60 V; and a range of a drain-source breakdown voltage is greater than or equal to 10 V and less than or equal to 120 V. In this way, in addition to the beneficial effects of the foregoing examples, because the second switch module 23 may be a low-power MOSFET, the conductive impedance of the switch circuit 20 in this embodiment can further be reduced. It is concluded after verification that the switch circuit 20 in this embodiment can make the conductive impedance decrease by at least 40%. In this way, the switching loss can further be reduced, and the power consumption is reduced, alleviating heating.

Figure 14:
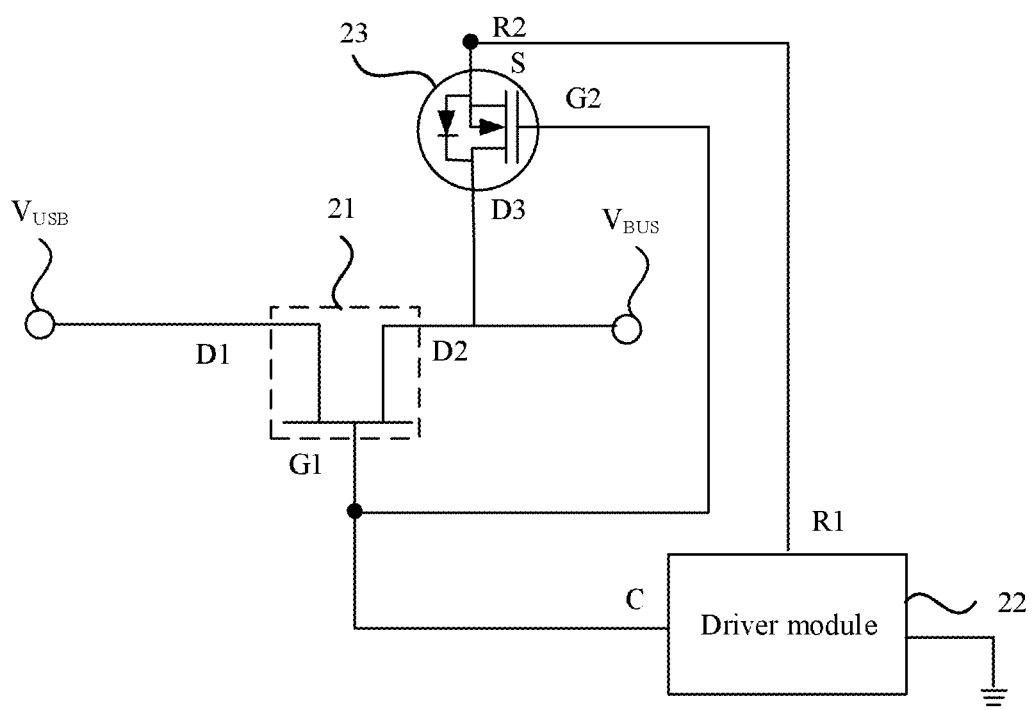
FIG. 14 is a schematic structural diagram of another switch circuit according to an embodiment of this application.

In addition, same as the foregoing example, as shown in FIG. 13, the switch circuit 20 may include a resistor 24. One terminal of the resistor 24 is coupled to the reference point R2, and the other terminal of the resistor 24 is grounded. In another optional embodiment, as shown in FIG. 14, the reference terminal R1 of the driver module 22 may alternatively be grounded.

With reference to the electronic device, the following describes a specific principle of implementing the bidirectional on and off functions of the switch circuit 20 shown in FIG. 13. An example in which the second switch module 23 is an NMOSFET, and a threshold voltage of the NMOSFET is 2 V is used for description.

Figure 15:
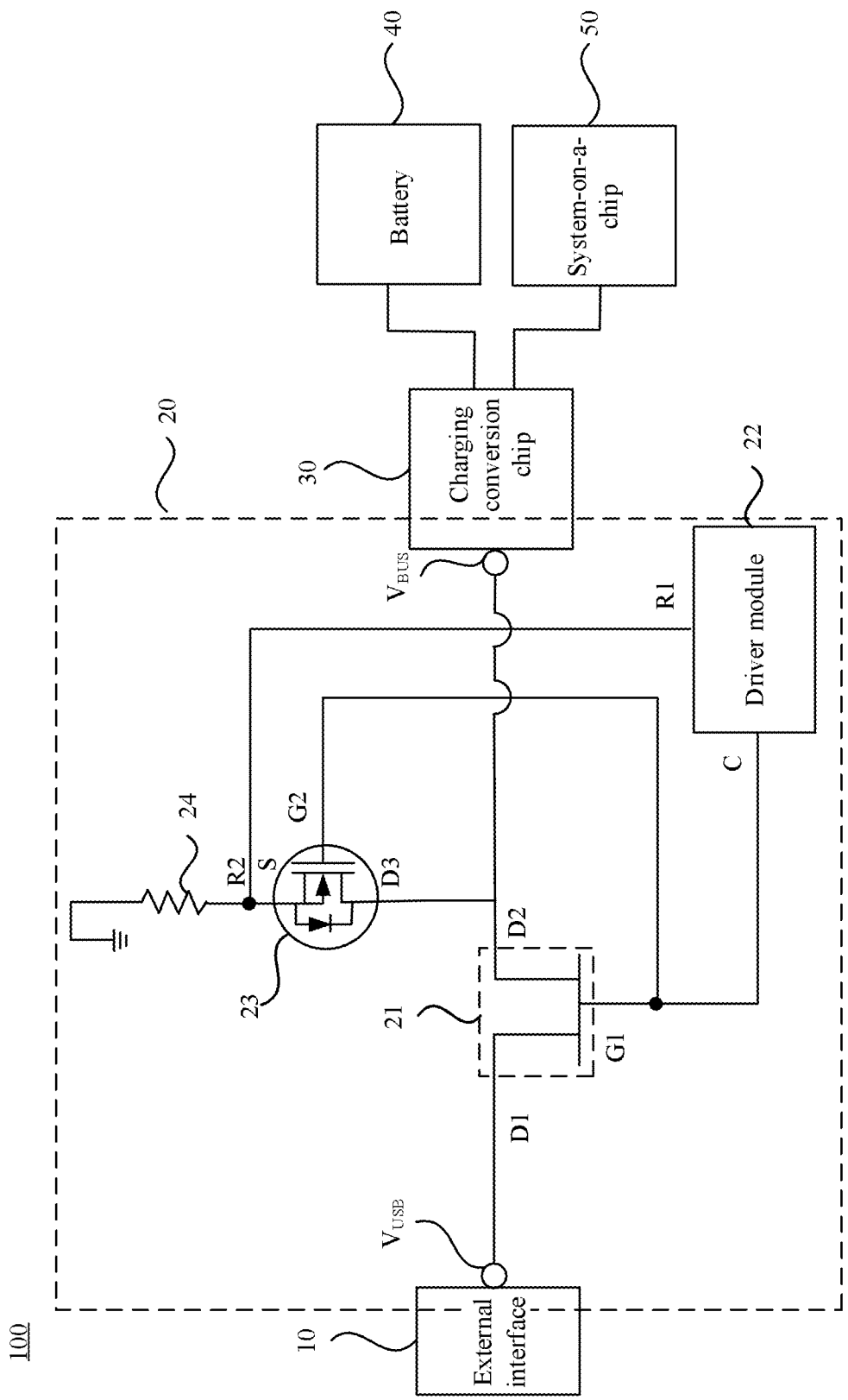
FIG. 15 is a schematic structural diagram of another electronic device according to an embodiment of this application.
Figure 16:
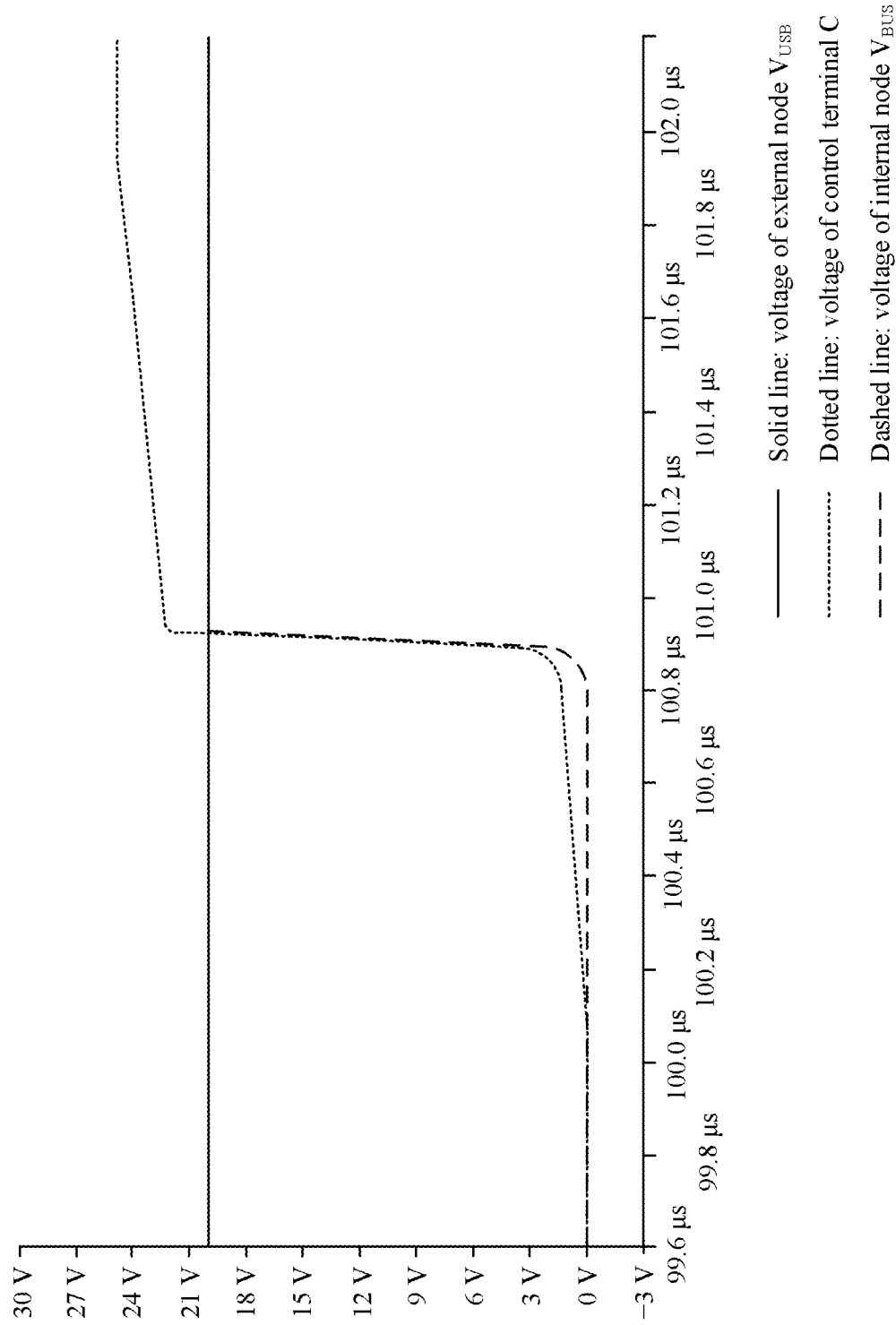
FIG. 16 is another simulation diagram during forward charging according to an embodiment of this application.

FIG. 16 is a simulation diagram during forward charging according to an embodiment. With reference to FIG. 2, FIG. 15, and FIG. 16, when the external device connected to the external port 10 is the charger 200, that is, when the charger 200 needs to charge the mobile phone 100, in other words, when the charging voltage received by the external node $V_{USB}$ needs to be transmitted to the internal node $V_{BUS}$, the enhancement-mode bidirectional gallium-nitride high-electron-mobility transistor and the NMOSFET need to change into the turn-on state from the turn-off state.

At the turn-off stage, that is, before 100 μs in FIG. 16, the enhancement-mode bidirectional gallium-nitride high-electron-mobility transistor and the NMOSFET are both turned off, and the voltage at the external node $V_{USB}$ is the charging voltage 20 V. In this case, the voltage of the internal node $V_{BUS}$ is 0 V, the voltages of the first gate electrode G1 and the second gate electrode G2 are also 0 V, and the voltages of the reference point R2, the second electrode D2, and the source electrode S are the same as that of the internal node $V_{BUS}$.

At the turn-on stage, to turn on the enhancement-mode bidirectional gallium-nitride high-electron-mobility transistor and the NMOSFET, the driver module 22 collects the voltage of the reference point R2 (the same as the voltage at the second electrode D2) in real time, and performs operation based on the reference point R2, so that the difference between the output first drive voltage and the collected voltage of the reference point R2 remains the first difference 5 V in real time. Therefore, when the voltage of the reference point R2 collected by the driver module 22 is 0 V, the driver module 22 gradually increases the first drive voltage applied to the first gate electrode G1 and the second gate electrode G2 to 5 V at 100 μs. As can be learned from FIG. 16, at 100.8 μs, the first drive voltage applied to the first gate electrode G1 and the second gate electrode G2 begins to become greater than 2 V. To be specific, when the voltage difference between the first gate electrode G1 (greater than 2 V) and the second electrode D2 (0 V) is greater than the threshold voltage 1.5 V of the enhancement-mode bidirectional gallium-nitride high-electron-mobility transistor, the enhancement-mode bidirectional gallium-nitride high-electron-mobility transistor is turned on; and when the voltage difference between the second gate electrode G1 (greater than 2 V) and the source electrode S (0 V) is greater than the threshold voltage 2 V of the NMOSFET, the NMOSFET is turned on, and a voltage begins to appear at the internal node $V_{BUS}$.

At the increase stage, that is, between 100.8 μs and 102 μs, after the enhancement-mode bidirectional gallium-nitride high-electron-mobility transistor and the NMOSFET are both turned on, the voltage at the internal node $V_{BUS}$ increases from 0 V to 20 V. Certainly, the voltage at the reference point R2 also increases from 0 V to 20 V. The driver module 22 collects the voltage of the reference point R2 (the same as the voltage at the second electrode D2) in real time, and performs operation based on the reference point R2, so that the difference between the output first drive voltage and the collected voltage of the reference point R2 remains the first difference 5 V in real time. Therefore, when the voltage at the reference point R2 also increases from 0 V to 20 V, the first drive voltage output by the control terminal C of the driver module 22 also gradually increases to 25 V accordingly.

At the stage after turn-on, that is, after 102 μs, the voltage at the internal node $V_{BUS}$ and the voltage at the reference point R2 both remain 20 V, and the first drive voltage output by the control terminal C of the driver module 22 also remains 25 V. In this way, the voltage difference between the first gate electrode G1 (25 V) and the second electrode D2 (20 V) remains 5 V, that is, is greater than the threshold voltage 1.5 V of the enhancement-mode bidirectional gallium-nitride high-electron-mobility transistor. The voltage difference between the second gate electrode G2 (25 V) and the source electrode S (20 V) remains 5 V, that is, is greater than the threshold voltage 2 V of the NMOSFET. During charging, the enhancement-mode bidirectional gallium-nitride high-electron-mobility transistor and the NMOSFET are always in the turn-on state. The charging voltage 20 V of the external node $V_{USB}$ is transmitted to the internal node $V_{BUS}$ by turning on the enhancement-mode bidirectional gallium-nitride high-electron-mobility transistor, so as to be transmitted to the charging conversion chip 30 through the internal node $V_{BUS}$. The charging conversion chip 30 converts the charging voltage, and outputs the converted voltage to the battery 40 to charge the battery 40. In addition, the converted voltage is transmitted to the system-on-a-chip (SoC) 50 to power the CPU, the GPU, the modem, and the like that are integrated in the system-on-a-chip (SoC) 50, ensuring normal operation of the CPU, the GPU, and the modem.

Figure 17:
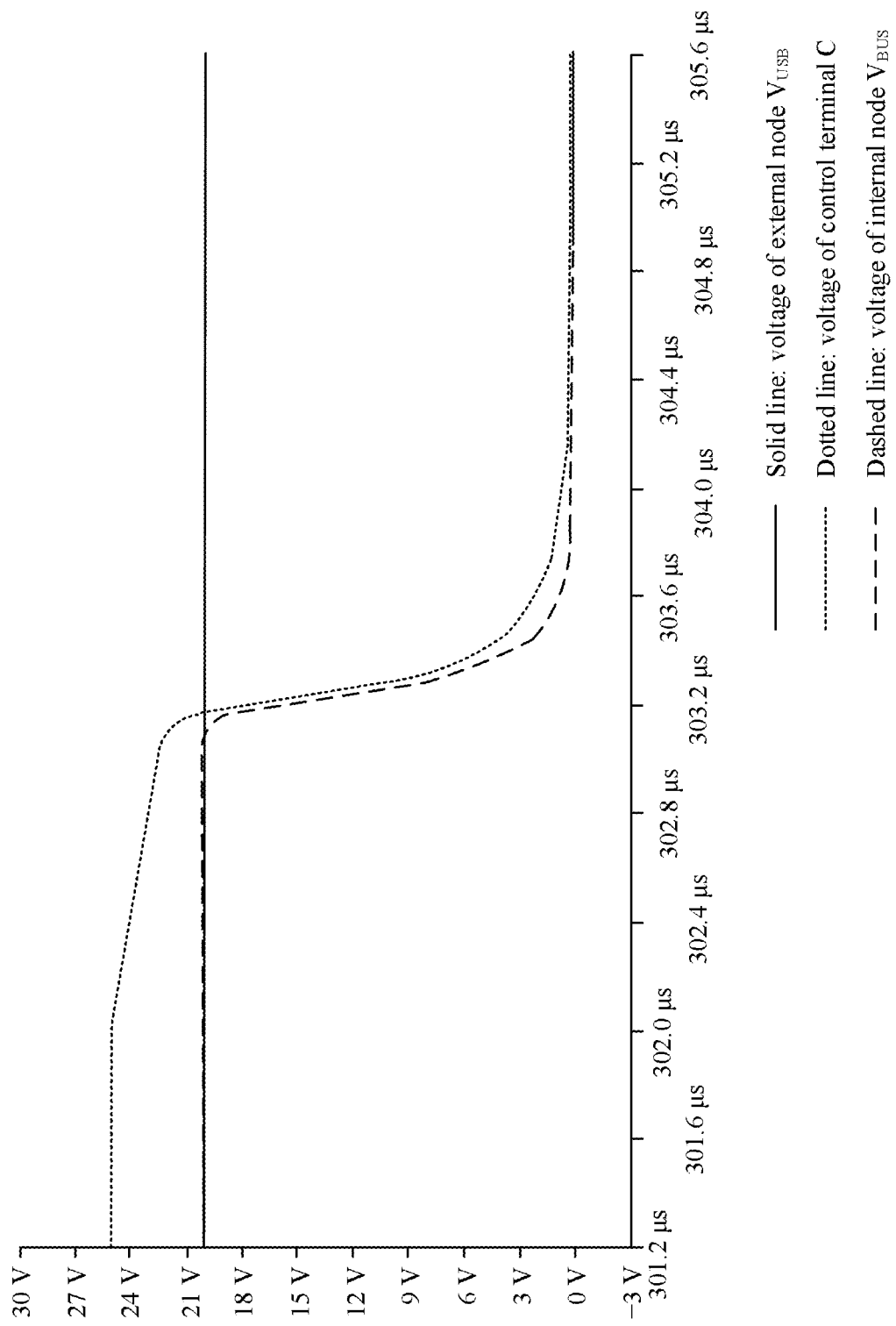
FIG. 17 is another simulation diagram during forward turn-off according to an embodiment of this application.

FIG. 17 is a simulation diagram during forward turn-off according to an embodiment. With reference to FIG. 2, FIG. 15, and FIG. 17, when charging is completed or a large voltage causes an exception such as damage of the mobile phone 100 during charging, the enhancement-mode bidirectional gallium-nitride high-electron-mobility transistor and the NMOSFET need to change into the turn-off state from the turn-on state.

At the turn-on stage, that is, before 302 μs in FIG. 17, the enhancement-mode bidirectional gallium-nitride high-electron-mobility transistor and the NMOSFET are both turned on, and the voltages of the external node $V_{USB}$, the internal node $V_{BUS}$, the second electrode D2, the source electrode S, the drain electrode D3, and the reference point R2 are all the charging voltage 20 V. The voltages of the first gate electrode G1 and the second gate electrode G2 are 25 V.

At the turn-off stage, to turn off the enhancement-mode bidirectional gallium-nitride high-electron-mobility transistor and the NMOSFET, the driver module 22 collects the voltage of the reference point R2 (the same as the voltage at the second electrode D2) in real time, and performs operation based on the reference point R2, so that the difference between the output second drive voltage and the collected voltage of the reference point R2 remains the second difference 0 V in real time. Therefore, at 302 μs, the second drive voltage output by the driver module 22 gradually decreases to 20 V. As can be learned from FIG. 17, at 303 μs, the second drive voltage applied to the first gate electrode G1 and the second gate electrode G2 decreases to 21.5 V. To be specific, when the voltage difference between the first gate electrode G1 (21.5 V) and the second electrode D2 (20 V) is equal to the threshold voltage 1.5 V of the enhancement-mode bidirectional gallium-nitride high-electron-mobility transistor, and the voltage difference between the second gate electrode G1 (21.5 V) and the source electrode S (20 V) is less than the threshold voltage 2 V of the NMOSFET, the enhancement-mode bidirectional gallium-nitride high-electron-mobility transistor and the NMOSFET begin to turn off, and the voltage at the internal node $V_{BUS}$ begins to decrease.

At the decrease stage, that is, between 303 μs and 305 μs, the enhancement-mode bidirectional gallium-nitride high-electron-mobility transistor and the NMOSFET cannot be turned off immediately. Therefore, the voltage at the internal node $V_{BUS}$ gradually decreases from 20 V to 0 V. Certainly, the voltage at the reference point R2 also gradually decreases from 20 V to 0 V. The driver module 22 collects the voltage of the reference point R2 in real time, and performs operation based on the reference point R2, so that the difference between the output second drive voltage and the collected voltage of the reference point R2 remains the second difference 0 V in real time. Therefore, when the voltage at the reference point R2 decreases from 20 V to 0 V, the second drive voltage output by the control terminal C of the driver module 22 also gradually decreases to 0 V accordingly.

At the stage after turn-off, that is, after 305 µs, the voltages at both the internal node $V_{BUS}$ and the reference point R2 remain 0 V, and the second drive voltage output by the control terminal C of the driver module 22 also remains 0 V. In this way, the voltage difference between the first gate electrode G1 (0 V) and the second electrode D2 (0 V) remains 0 V, that is, is less than the threshold voltage 1.5 V of the enhancement-mode bidirectional gallium-nitride high-electron-mobility transistor. The voltage difference between the second gate electrode G2 (0 V) and the source electrode S (0 V) remains 0 V, that is, is less than the threshold voltage 2 V of the NMOSFET, so that the enhancement-mode bidirectional gallium-nitride high-electron-mobility transistor and the NMOSFET are always in the turn-off state. The charging voltage that is output by the charger 200 cannot be transmitted to the charging conversion chip 30. The charging conversion chip 30 cannot supply power to the battery 40, and the CPU, the GPU, the modem, and the like that are integrated in the system-on-a-chip (SoC) 50.

Figure 18:
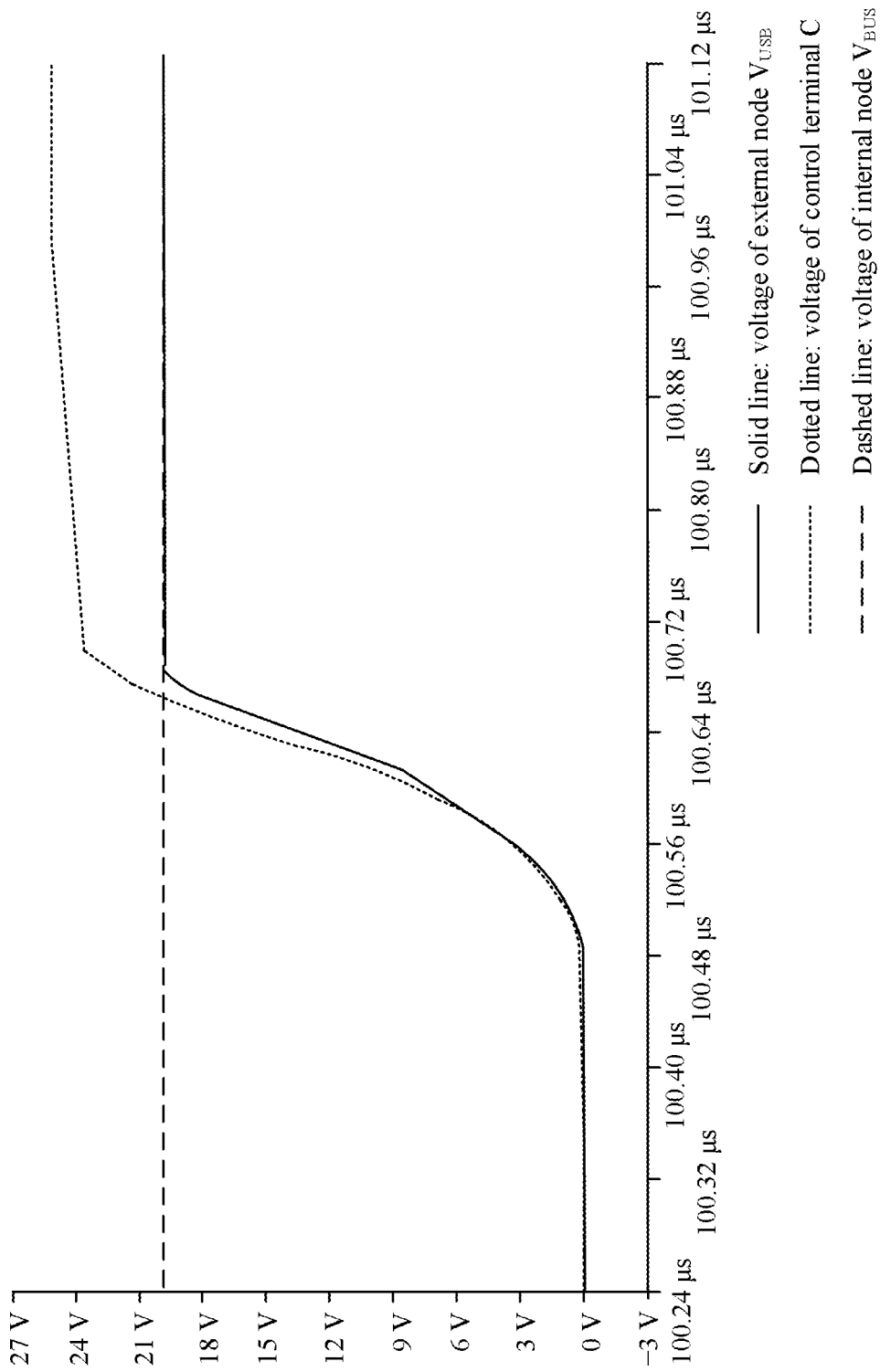
FIG. 18 is another simulation diagram during reverse charging according to an embodiment of this application.

FIG. 18 is a simulation diagram during reverse charging according to an embodiment. With reference to FIG. 3, FIG. 15, and FIG. 18, when the external device connected to the external port 10 is a to-be-charged mobile phone 300, that is, when the mobile phone 100 needs to charge the to-be-charged mobile phone 300, in other words, when the charging voltage received by the internal node $V_{BUS}$ needs to be transmitted to the external node $V_{USB}$, the enhancement-mode bidirectional gallium-nitride high-electron-mobility transistor and the NMOSFET need to change into the turn-on state from the turn-off state.

At the turn-off stage, that is, before 100.4 µs in FIG. 18, the enhancement-mode bidirectional gallium-nitride high-electron-mobility transistor and the NMOSFET are both turned off, and the voltage at the internal node $V_{BUS}$ is the charging voltage 20 V. In this case, the voltage of the external node $V_{USB}$ is 0 V, the voltages of the first gate electrode G1 and the second gate electrode G2 are also 0 V, and the voltages of the reference point R2, the second electrode D2, and the source electrode S are the same as that of the external node $V_{USB}$.

At the turn-on stage, to turn on the enhancement-mode bidirectional gallium-nitride high-electron-mobility transistor and the NMOSFET, the driver module 22 collects the voltage of the reference point R2 (the same as the voltage at the second electrode D2) in real time, and performs operation based on the reference point R2, so that the difference between the output third drive voltage and the collected voltage of the reference point R2 remains the third difference 5 V in real time. Therefore, when the voltage of the reference point R2 collected by the driver module 22 is 0 V, the driver module 22 gradually increases the first drive voltage applied to the first gate electrode G1 and the second gate electrode G2 to 5 V at 100.4 µs. As can be learned from FIG. 18, at 100.48 µs, the first drive voltage applied to the first gate electrode G1 and the second gate electrode G2 begins to become greater than 2 V. To be specific, when the voltage difference between the first gate electrode G1 (greater than 2 V) and the first electrode D1 (0 V) is greater than the threshold voltage 1.5 V of the enhancement-mode bidirectional gallium-nitride high-electron-mobility transistor, the enhancement-mode bidirectional gallium-nitride high-electron-mobility transistor is turned on; and when the voltage difference between the second gate electrode G1 (greater than 2 V) and the source electrode S (0 V) is greater than the threshold voltage 2 V of the NMOSFET, the NMOSFET is turned on, and a voltage begins to appear at the external node $V_{USB}$.

At the increase stage, that is, between 100.48 µs and 101 µs, after the enhancement-mode bidirectional gallium-nitride high-electron-mobility transistor and the NMOSFET are both turned on, the voltage at the external node $V_{USB}$ increases from 0 V to 20 V. Certainly, the voltage at the reference point R2 also increases from 0 V to 20 V. The driver module 22 collects the voltage of the reference point R2 in real time, and performs operation based on the reference point R2, so that the difference between the output third drive voltage and the collected voltage of the reference point R2 remains the third difference 5 V in real time. Therefore, when the voltage at the reference point R2 also increases from 0 V to 20 V, the third drive voltage output by the control terminal C of the driver module 22 also gradually increases to 25 V accordingly.

At the stage after turn-on, that is, after 101 µs, the voltage at the external node $V_{USB}$ and the voltage at the reference point R2 both remain 20 V, and the third drive voltage output by the control terminal C of the driver module 22 also remains 25 V. In this way, the voltage difference between the first gate electrode G1 (25 V) and the first electrode D1 (20 V) remains 5 V, that is, is greater than the threshold voltage 1.5 V of the enhancement-mode bidirectional gallium-nitride high-electron-mobility transistor. The voltage difference between the second gate electrode G2 (25 V) and the source electrode S (20 V) remains 5 V, that is, is greater than the threshold voltage 2 V of the NMOSFET. During charging, the enhancement-mode bidirectional gallium-nitride high-electron-mobility transistor and the NMOSFET are always in the turn-on state, ensuring normal charging.

Figure 19:
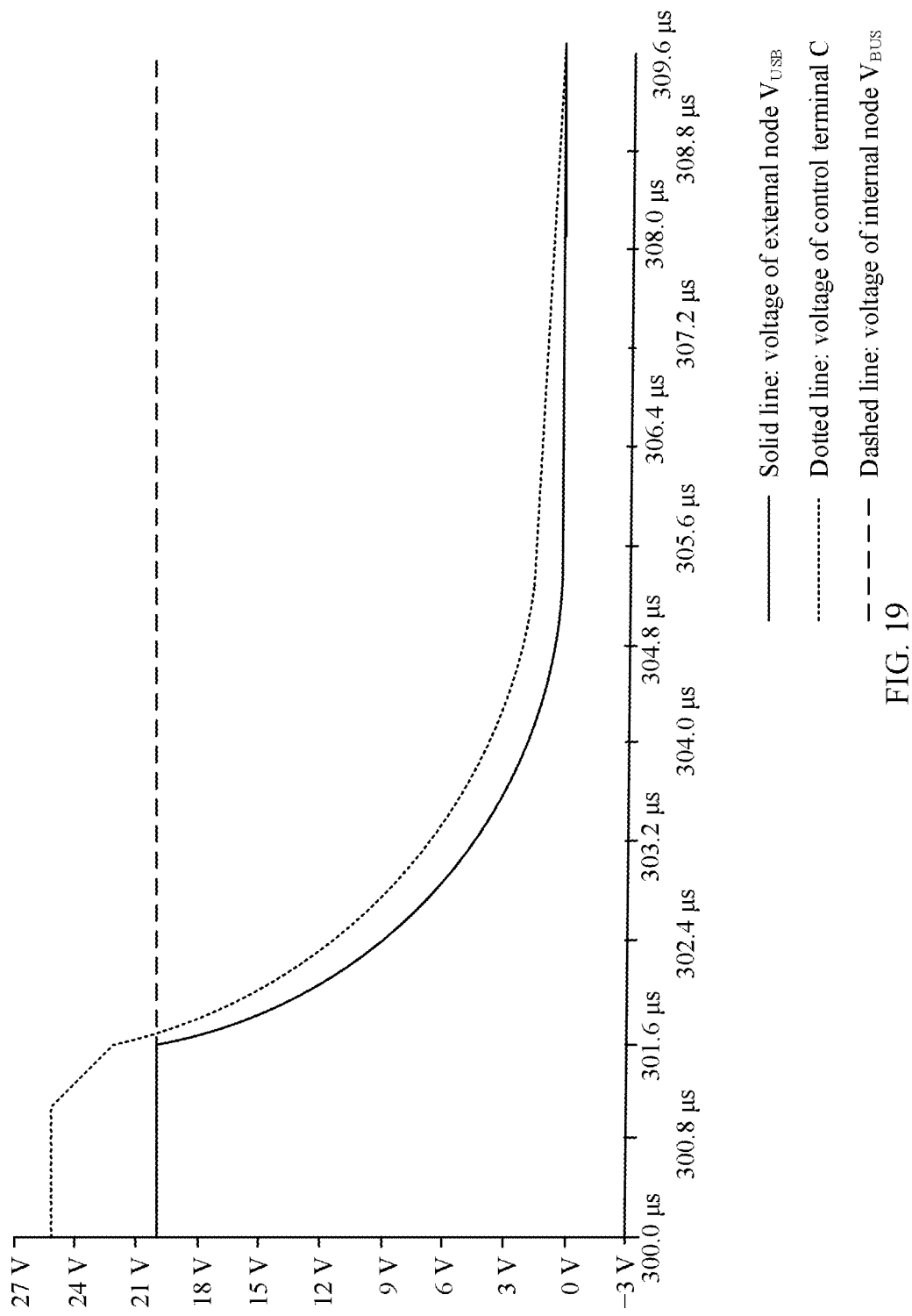
FIG. 19 is another simulation diagram during reverse turn-off according to an embodiment of this application.

FIG. 19 is a simulation diagram during reverse turn-off according to an embodiment. With reference to FIG. 3, FIG. 15, and FIG. 19, when charging is completed or a large voltage causes an exception such as damage of the mobile phone 100 during charging, the enhancement-mode bidirectional gallium-nitride high-electron-mobility transistor and the NMOSFET need to change into the turn-off state from the turn-on state.

At the turn-on stage, that is, before 301 µs in FIG. 12, the enhancement-mode bidirectional gallium-nitride high-electron-mobility transistor and the NMOSFET are both turned on, and the voltages of the external node $V_{USB}$, the internal node $V_{BUS}$, the second electrode D2, the source electrode S, the drain electrode D3, and the reference point R2 are all the charging voltage 20 V. The voltages of the first gate electrode G1 and the second gate electrode G2 are 25 V.

At the turn-off stage, to turn off the enhancement-mode bidirectional gallium-nitride high-electron-mobility transistor and the NMOSFET, the driver module 22 collects the voltage of the reference point R2 (the same as the voltage at the second electrode D2) in real time, and performs operation based on the reference point R2, so that the difference between the output fourth drive voltage and the collected voltage of the reference point R2 remains the fourth difference 0 V in real time. Therefore, at 301 µs, the fourth drive voltage output by the driver module 22 gradually decreases to 20 V. As can be learned from FIG. 12, at 302 µs, the fourth drive voltage applied to the first gate electrode G1 and the second gate electrode G2 decreases to 21.5 V. To be specific, when the voltage difference between the first gate electrode G1 (21.5 V) and the first electrode D1 (20 V) is equal to the threshold voltage 1.5 V of the enhancement-mode bidirectional gallium-nitride high-electron-mobility transistor, and the voltage difference between the second gate electrode G1 (21.5 V) and the source electrode S (20 V) is less than the threshold voltage 2 V of the NMOSFET, the enhancement-mode bidirectional gallium-nitride high-electron-mobility transistor and the NMOSFET begin to turn off, and the voltage at the internal node $V_{BUS}$ begins to decrease from 20 V.

At the decrease stage, that is, between 302 µs and 309.6 µs, the enhancement-mode bidirectional gallium-nitride high-electron-mobility transistor and the NMOSFET cannot be turned off immediately. Therefore, the voltage at the internal node $V_{BUS}$ gradually decreases from 20 V to 0 V. Certainly, the voltage at the reference point R2 also gradually decreases from 20 V to 0 V. The driver module 22 collects the voltage of the reference point R2 in real time, and performs operation based on the reference point R2, so that the difference between the output fourth drive voltage and the collected voltage of the reference point R2 remains the fourth difference 0 V in real time. Therefore, when the voltage at the reference point R2 decreases from 20 V to 0 V, the fourth drive voltage output by the control terminal C of the driver module 22 also gradually decreases to 0 V accordingly.

At the stage after turn-off, that is, after 309.6 µs, the voltages at both the internal node $V_{BUS}$ and the reference point R2 remain 0 V, and the fourth drive voltage output by the control terminal C of the driver module 22 also remains 0 V. In this way, the voltage difference between the first gate electrode G1 (0 V) and the first electrode D1 (0 V) remains 0 V, that is, is less than the threshold voltage 1.5 V of the enhancement-mode bidirectional gallium-nitride high-electron-mobility transistor. The voltage difference between the second gate electrode G2 (0 V) and the source electrode S (0 V) remains 0 V, that is, is less than the threshold voltage 2 V of the NMOSFET, so that the enhancement-mode bidirectional gallium-nitride high-electron-mobility transistor and the NMOSFET are always in the turn-off state. Therefore, the enhancement-mode bidirectional gallium-nitride high-electron-mobility transistor is completely turned off.

In conclusion, it should be noted that the foregoing embodiments are merely intended for describing the technical solutions of this application, but not for limiting this application. Although this application is described in detail with reference to the foregoing embodiments, persons of ordinary skills in the art should understand that they may still make modifications to the technical solutions described in the foregoing embodiments or make equivalent replacements to some technical features thereof, without departing from the scope of the technical solutions of the embodiments of this application.

What is claimed is:

1. A switch circuit, comprising:
   an external node;
   an internal node;
   a first switch circuit; and
   a driver circuit;
   wherein the first switch circuit comprises an enhancement-mode gallium-nitride high-electron-mobility transistor, the enhancement-mode gallium-nitride high-electron-mobility transistor comprises a first gate electrode, a first electrode, and a second electrode, and the driver circuit comprises a control terminal;
   wherein the first gate electrode is coupled to the control terminal, the first electrode is coupled to the external node, and the internal node is coupled to the second electrode;
   wherein:
       the external node is configured to receive a charging voltage, and transmit the charging voltage to the enhancement-mode gallium-nitride high-electron-mobility transistor; the driver circuit is configured to control on or off of the enhancement-mode gallium-nitride high-electron-mobility transistor; and based on the enhancement-mode gallium-nitride high-electron-mobility transistor being turned on, the charging voltage is transmitted to the internal node, so as to be transmitted to a charging conversion chip through the internal node; or
       the internal node is configured to receive a charging voltage, and transmit the charging voltage to the enhancement-mode gallium-nitride high-electron-mobility transistor; the driver circuit is configured to control on or off of the enhancement-mode gallium-nitride high-electron-mobility transistor; and based on the enhancement-mode gallium-nitride high-electron-mobility transistor being turned on, the charging voltage is transmitted to the external node, so as to be transmitted to a to-be-charged electronic device through the external node;
   wherein the driver circuit further comprises a reference terminal, and wherein the second electrode and the reference terminal are coupled to a reference point; and
   wherein:
       based on the external node receiving the charging voltage, the driver circuit sends a first drive voltage to the first gate electrode based on a voltage of the reference point, and the enhancement-mode gallium-nitride high-electron-mobility transistor is turned on in response to the first drive voltage and transmits the charging voltage to the internal node; and the driver circuit further sends a second drive voltage to the first gate electrode based on the voltage of the reference point, and the enhancement-mode gallium-nitride high-electron-mobility transistor is turned off in response to the second drive voltage; or
       based on the internal node receiving the charging voltage, the driver circuit sends a third drive voltage to the first gate electrode based on a voltage of the reference point, and the enhancement-mode gallium-nitride high-electron-mobility transistor is turned on in response to the third drive voltage and transmits the charging voltage to the external node; and the driver circuit further sends a fourth drive voltage to the first gate electrode, and the enhancement-mode gallium-nitride high-electron-mobility transistor is turned off in response to the fourth drive voltage.

2. The switch circuit according to claim 1, further comprising:
   a second switch circuit, wherein the second switch circuit is configured to prevent the internal node from transmitting the received charging voltage to the reference point based on the driver circuit sending the fourth drive voltage to the first gate electrode; and wherein the driver circuit sends the fourth drive voltage to the first gate electrode based on the voltage of the reference point, and the enhancement-mode gallium-nitride high-electron-mobility transistor is turned off in response to the fourth drive voltage.

3. The switch circuit according to claim 2,
wherein the second switch circuit comprises an n-type metal oxide semiconductor field effect transistor;
wherein the n-type metal-oxide semiconductor field-effect transistor comprises a second gate electrode, a source electrode, and a drain electrode; and
wherein the source electrode is coupled to the second electrode, and the drain electrode is coupled to the internal node.

4. The switch circuit according to claim 2,
wherein the second switch circuit comprises an n-type metal oxide semiconductor field effect transistor;
wherein the n-type metal-oxide semiconductor field-effect transistor comprises a second gate electrode, a source electrode, and a drain electrode; and
wherein the drain electrode is separately coupled to the second electrode and the internal node, and the source electrode is coupled to the reference point.

5. The switch circuit according to claim 4, wherein a range of a conductive impedance of the n-type metal oxide semiconductor field effect transistor is greater than or equal to 1 ohm and less than or equal to 100 ohms, a withstand voltage range from the second gate electrode to the source electrode of the n-type metal oxide semiconductor field effect transistor is greater than or equal to 5 V and less than or equal to 60 V, and a range of a drain-source breakdown voltage of the n-type metal oxide semiconductor field effect transistor is greater than or equal to 10 V and less than or equal to 120 V.

6. The switch circuit according to claim 3, wherein the first gate electrode is coupled to the second gate electrode.

7. The switch circuit according to claim 1, further comprising:
a resistor, wherein a first terminal of the resistor is coupled to the reference point, and a second terminal of the resistor is grounded.

8. The switch circuit according to claim 7, wherein a resistance of the resistor is greater than 100 kilohms.

9. The switch circuit according to claim 1, wherein the enhancement-mode gallium-nitride high-electron-mobility transistor comprises an enhancement-mode bidirectional gallium-nitride high-electron-mobility transistor.

10. An electronic device, comprising:
a switch circuit that includes an external node, an internal node, a first switch circuit, and a driver circuit;
wherein the first switch circuit comprises an enhancement-mode gallium-nitride high-electron-mobility transistor, the enhancement-mode gallium-nitride high-electron-mobility transistor comprises a first gate electrode, a first electrode, and a second electrode, and the driver circuit comprises a control terminal;
wherein the first gate electrode is coupled to the control terminal, the first electrode is coupled to the external node, and the internal node is coupled to the second electrode;
wherein:
the external node is configured to receive a charging voltage, and transmit the charging voltage to the enhancement-mode gallium-nitride high-electron-mobility transistor; the driver circuit is configured to control on or off of the enhancement-mode gallium-nitride high-electron-mobility transistor; and based on the enhancement-mode gallium-nitride high-electron-mobility transistor being turned on, the charging voltage is transmitted to the internal node, so as to be transmitted to a charging conversion chip through the internal node; or
the internal node is configured to receive a charging voltage, and transmit the charging voltage to the enhancement-mode gallium-nitride high-electron-mobility transistor; the driver circuit is configured to control on or off of the enhancement-mode gallium-nitride high-electron-mobility transistor; and based on the enhancement-mode gallium-nitride high-electron-mobility transistor being turned on, the charging voltage is transmitted to the external node, so as to be transmitted to a to-be-charged electronic device through the external node;
wherein the driver circuit further comprises a reference terminal, and wherein the second electrode and the reference terminal are coupled to a reference point; and
wherein:
based on the external node receiving the charging voltage, the driver circuit sends a first drive voltage to the first gate electrode based on a voltage of the reference point, and the enhancement-mode gallium-nitride high-electron-mobility transistor is turned on in response to the first drive voltage and transmits the charging voltage to the internal node; and the driver circuit further sends a second drive voltage to the first gate electrode based on the voltage of the reference point, and the enhancement-mode gallium-nitride high-electron-mobility transistor is turned off in response to the second drive voltage; or
based on the internal node receiving the charging voltage, the driver circuit sends a third drive voltage to the first gate electrode based on a voltage of the reference point, and the enhancement-mode gallium-nitride high-electron-mobility transistor is turned on in response to the third drive voltage and transmits the charging voltage to the external node; and the driver circuit further sends a fourth drive voltage to the first gate electrode, and the enhancement-mode gallium-nitride high-electron-mobility transistor is turned off in response to the fourth drive voltage.

11. The electronic device according to claim 10, wherein the switch circuit further includes:
a second switch circuit, wherein the second switch circuit is configured to prevent the internal node from transmitting the received charging voltage to the reference point based on the driver circuit sending the fourth drive voltage to the first gate electrode; and
wherein the driver circuit sends the fourth drive voltage to the first gate electrode based on the voltage of the reference point, and the enhancement-mode gallium-nitride high-electron-mobility transistor is turned off in response to the fourth drive voltage.

12. The electronic device according to claim 11,
wherein the second switch circuit comprises an n-type metal oxide semiconductor field effect transistor;
wherein the n-type metal-oxide semiconductor field-effect transistor comprises a second gate electrode, a source electrode, and a drain electrode; and
wherein the source electrode is coupled to the second electrode, and the drain electrode is coupled to the internal node.

13. The electronic device according to claim 11,
wherein the second switch circuit comprises an n-type metal oxide semiconductor field effect transistor;

wherein the n-type metal-oxide semiconductor field-effect transistor comprises a second gate electrode, a source electrode, and a drain electrode; and wherein the drain electrode is separately coupled to the second electrode and the internal node, and the source electrode is coupled to the reference point.

14. The electronic device according to claim 13, wherein a range of a conductive impedance of the n-type metal oxide semiconductor field effect transistor is greater than or equal to 1 ohm and less than or equal to 100 ohms, a withstand voltage range from the second gate electrode to the source electrode of the n-type metal oxide semiconductor field effect transistor is greater than or equal to 5 V and less than or equal to 60 V, and a range of a drain-source breakdown voltage of the n-type metal oxide semiconductor field effect transistor is greater than or equal to 10 V and less than or equal to 120 V.

15. The electronic device according to claim 12, wherein the first gate electrode is coupled to the second gate electrode.

16. The electronic device according to claim 10, wherein the switch circuit further includes:
a resistor, wherein a first terminal of the resistor is coupled to the reference point, and a second terminal of the resistor is grounded.

17. The electronic device according to claim 16, wherein a resistance of the resistor is greater than 100 kilohms.

18. The electronic device according to claim 10, wherein the enhancement-mode gallium-nitride high-electron-mobility transistor comprises an enhancement-mode bidirectional gallium-nitride high-electron-mobility transistor.

* * * * *